(12) United States Patent
Arimoto

(10) Patent No.: US 6,256,252 B1
(45) Date of Patent: Jul. 3, 2001

(54) MEMORY-EMBEDDED SEMICONDUCTOR INTEGRATED CIRCUIT DEVICE HAVING LOW POWER CONSUMPTION

(75) Inventor: Kazutami Arimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/659,552

(22) Filed: Sep. 11, 2000

(30) Foreign Application Priority Data

Sep. 20, 1999 (JP) .................................................. 11-264779

(51) Int. Cl.$^7$ ....................................................... G11C 7/00
(52) U.S. Cl. ............................ 365/227; 365/222; 365/228
(58) Field of Search .................................. 365/226, 227, 365/222, 228, 229

(56) References Cited

U.S. PATENT DOCUMENTS

| | | | |
|---|---|---|---|
| 4,963,769 | * 10/1990 | Hiltpold et al. | 365/185.18 |
| 5,140,557 | * 8/1992 | Yoshida | 365/226 |
| 5,262,999 | * 11/1993 | Etoh et al. | 365/226 |
| 6,134,171 | * 10/2000 | Yamagata et al. | 365/229 |

FOREIGN PATENT DOCUMENTS

| 8-234877 | 9/1996 | (JP) . |
|---|---|---|
| 10-228774 | 8/1998 | (JP) . |

\* cited by examiner

*Primary Examiner*—Son Mai
(74) *Attorney, Agent, or Firm*—McDermott, Will & Emery

(57) ABSTRACT

In a sleep mode, data held in a logic circuit is saved to a memory circuit under the control of a transfer control circuit, and thereafter supply of an operation power supply voltage to the logic circuit from a logic power source is stopped. A memory-embedded LSI capable of reducing current consumption in a standby state is provided.

20 Claims, 17 Drawing Sheets

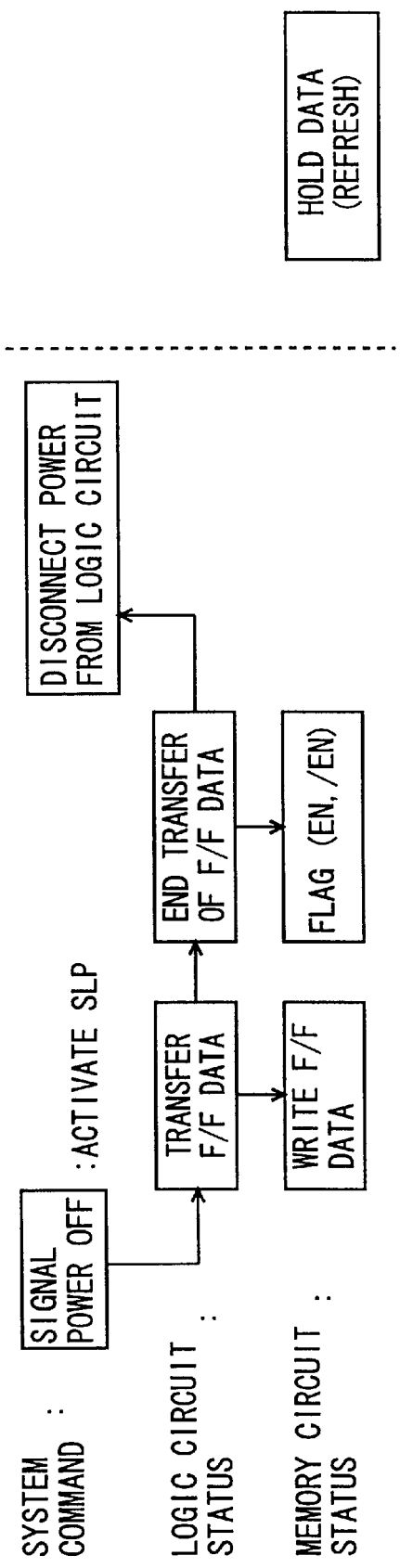
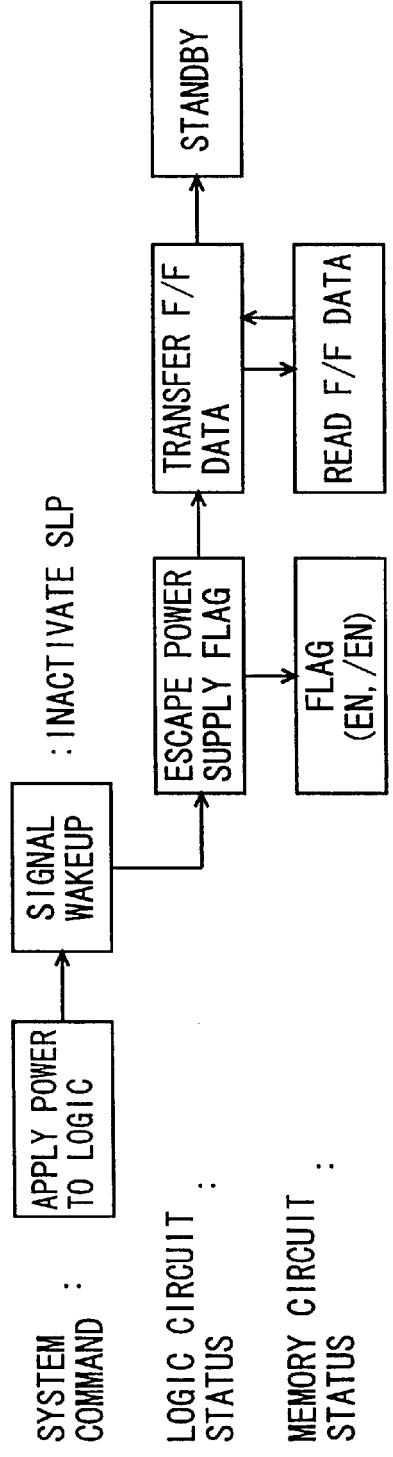
FIG. 12A
FIG. 12B

FIG. 13

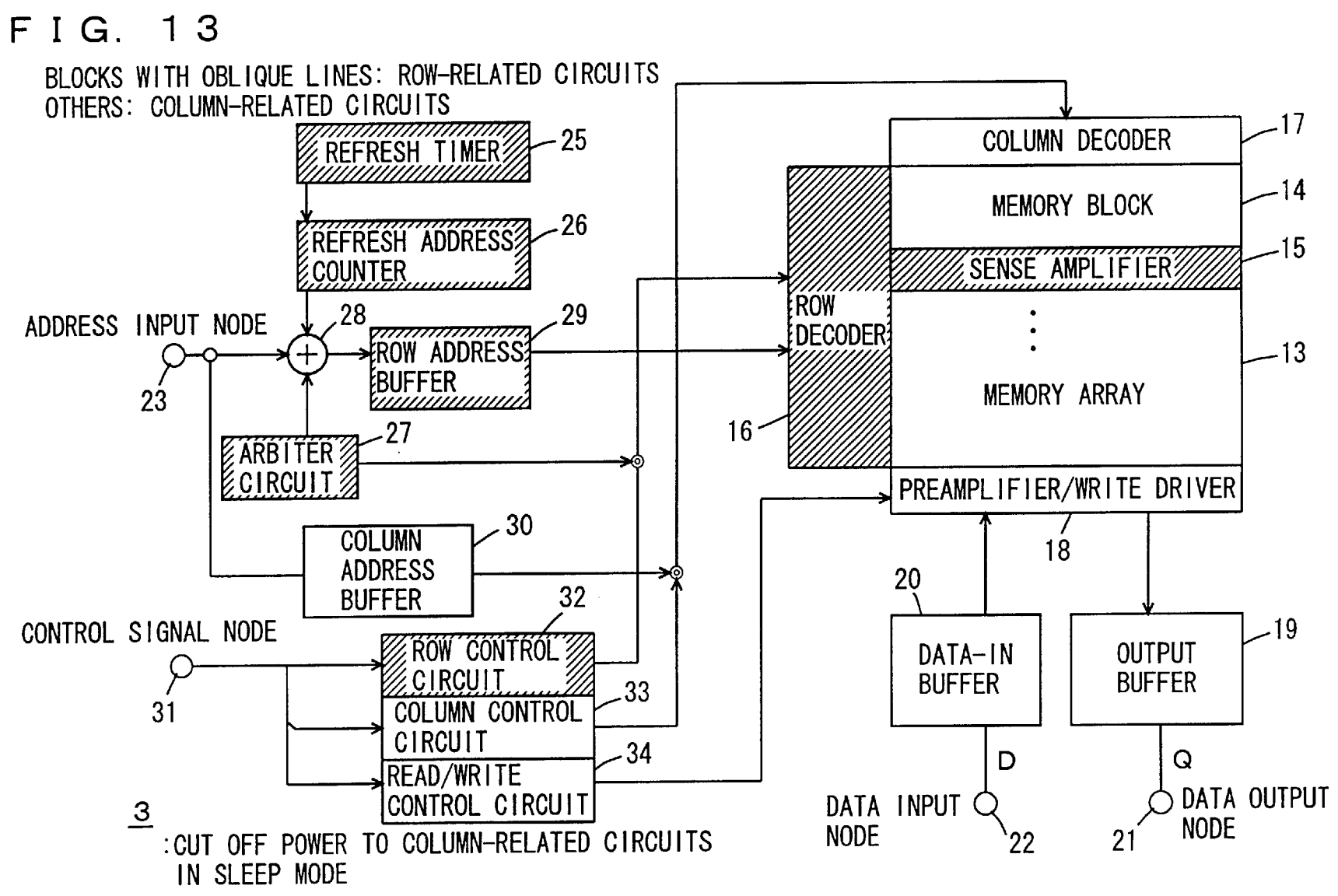

BLOCKS WITH OBLIQUE LINES: ROW-RELATED CIRCUITS
OTHERS: COLUMN-RELATED CIRCUITS

3 : CUT OFF POWER TO COLUMN-RELATED CIRCUITS IN SLEEP MODE

MEMORY-EMBEDDED SEMICONDUCTOR INTEGRATED CIRCUIT DEVICE HAVING LOW POWER CONSUMPTION

BACKGROUND OF THE INVENTION

1. Field of the Invention

The present invention relates to a semiconductor integrated circuit device, and more particularly, it relates to a semiconductor integrated circuit device having a memory circuit and a logic circuit integrated on the same semiconductor substrate. More specifically, the present invention relates to a structure for reducing power consumption in a memory-embedded semiconductor integrated circuit device.

2. Description of the Background Art

A system LSI or a memory-embedded LSI formed by integrating a logic circuit and a memory circuit on the same semiconductor substrate is widely employed. In the memory-embedded LSI, the logic circuit and the memory circuit are interconnected with each other through internal interconnection lines on the semiconductor substrate. The internal interconnection line has a smaller load as compared with an onboard wire, and can transmit signals/data at a high speed with low power consumption. The internal interconnection line provided on the semiconductor substrate is not influenced by pitch condition on a pin terminal, and hence the bit width of data between the logic circuit and the memory circuit can be increased to increase the bandwidth in data transmission.

The gate scale of such a memory-embedded LSI is increased in the trend of system integration for implementing a high-functional system with a small area. Further, improvement of the performance of the memory-embedded LSI is attained by reducing a power supply voltage for reducing power consumption and increasing the processing speed.

When the number of gates (number of transistors) of a logic LSI is increased, the total subthreshold current of the transistors is generally increased to disadvantageously increase power consumption in a standby state.

In order to implement a high-speed operation under a low power supply voltage, the absolute values Vth of the threshold voltages of the transistors must be reduced. When the absolute values Vth of the threshold voltages are reduced, however, the subthreshold current is increased to disadvantageously increase power consumption in the standby state.

When the memory-embedded LSI is applied to a portable equipments, the life of a battery serving as a driving power source is reduced due to power consumption increased in the standby state.

SUMMARY OF THE INVENTION

An object of the present invention is to provide a semiconductor integrated circuit device capable of reducing power consumption in a standby state.

Another object of the present invention is to provide a memory-embedded LSI capable of operating at a high speed with low current consumption under a low power supply voltage.

A specific object of the present invention is to provide a memory-embedded LSI capable of remarkably reducing a standby current.

The semiconductor integrated circuit device according to the present invention includes a logic circuit performing prescribed processing, a memory circuit for storing data used in the logic circuit, a data save circuit for transferring data of the logic circuit to the memory circuit and making the memory circuit store the transferred data in a specific operation mode, and a power source for stopping supply of a power supply voltage to the logic circuit in the specific operation mode.

Supply of the power supply voltage to the logic circuit can be stopped by saving the data held in the logic circuit into the memory circuit and holding the data in the memory circuit in the specific operation mode, thereby reducing the subthreshold current in the logic circuit. Thus, the absolute values of the threshold voltages of MOS transistors forming the logic circuit can be reduced, the semiconductor integrated circuit device can operate at a high speed under a low power supply voltage, and current consumption resulting from a leakage current can be reduced in the standby state.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B represent flows of operation sequences in power-down and power-up modes in a sleep mode of a semiconductor integrated circuit device according to a second embodiment of the present invention;

FIG. 13 schematically illustrates the overall structure of a semiconductor integrated circuit device according to a third embodiment of the present invention;

DESCRIPTION OF THE PREFERRED EMBODIMENTS

[First Embodiment]

Figure 1:
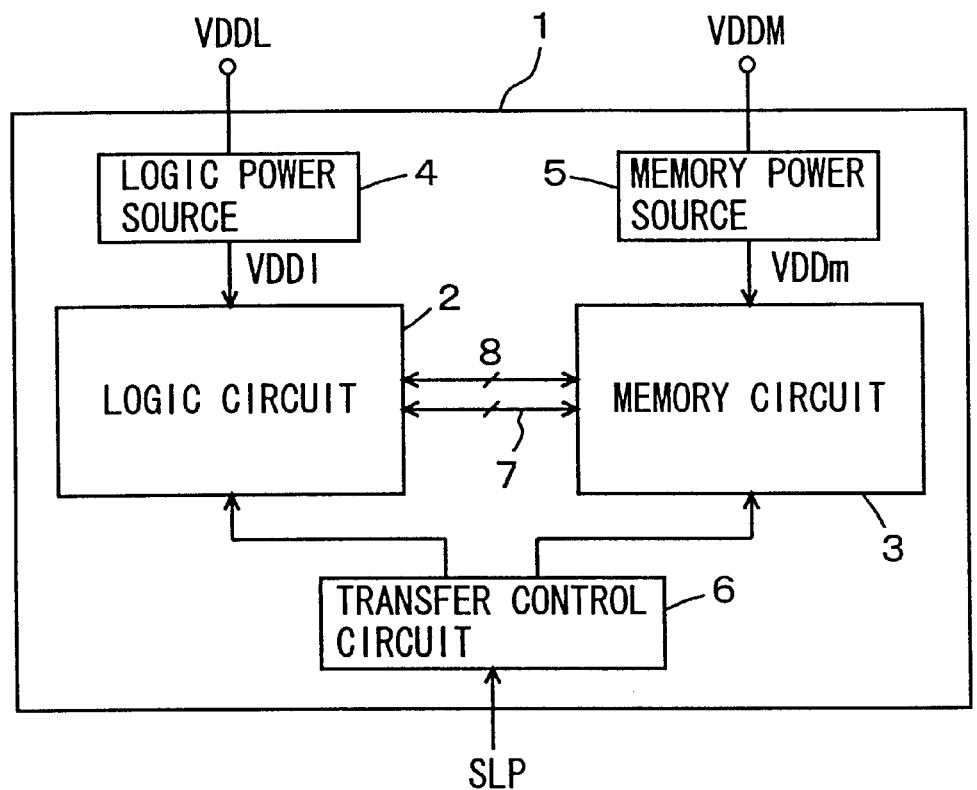
FIG. 1 schematically illustrates the overall structure of a semiconductor integrated circuit device according to a first embodiment of the present invention.

FIG. 1 schematically illustrates the overall structure of a semiconductor integrated circuit device 1 according to a first embodiment of the present invention. Referring to FIG. 1, the semiconductor integrated circuit device (hereinafter referred to as a memory-embedded LSI) 1 includes a logic circuit 2 performing prescribed processing, a memory circuit 3 transmitting/receiving data/signals to/from logic circuit 2 and storing data necessary at least for logic circuit 2, a logic power source 4 receiving an external logic power supply voltage VDDL and supplying an operation power supply voltage VDDl to logic circuit 2, a memory power source 5 receiving an external memory power supply voltage VDDM and supplying an operation power supply voltage VDDm to memory circuit 3, and a transfer control circuit 6 for transferring data between logic circuit 2 and memory circuit 3 in accordance with a standby state instruction signal (sleep mode instruction signal) SLP supplied from an external main processor, for example.

A data bus 7 couples the logic circuit 2 and the memory circuit 3 with each other. Logic circuit 2 supplies an address signal and a command or a control signal designating an operation mode to memory circuit 3 through a control bus 8, thereby executing data transfer between logic circuit 2 and memory circuit 3 through data bus 7.

When a system including the memory-embedded LSI 1 is not used over a relatively long period, the main processor detects this and activates the sleep mode instruction signal SLP. When sleep mode instruction signal SLP is activated, data included in logic circuit 2 are saved to memory circuit 3 through data bus 7 under the control of transfer control circuit 6. When this saving is completed, transfer control circuit 6 signals a main processor (not shown) 8 of completion of this saving and stops supply of logic power supply voltage VDDL to logic power source 4. Memory power source 5 is still supplied with memory power supply voltage VDDM regardless of the active state of sleep mode instruction signal SLP.

Logic circuit 2 includes a large number of MOS (insulated gate field effect) transistors as components. In a standby state, current consumption by the subthreshold current in logic circuit 2 can be prevented by stopping supply of the power supply voltage VDDl to logic circuit 2.

Thus, MOS transistors having low threshold voltages (MOS transistors having small absolute values of threshold voltages) can be used in logic circuit 2, so that logic circuit 2 can operate at a high speed even under a low power supply voltage.

Memory circuit 3 may be any of a dynamic random access memory (DRAM), a static random access memory (SRAM and a flash memory (flash EEPROM). When memory circuit 3 is a DRAM, a boosted voltage VPP is used for driving a word line to a selected state and hence, the gate insulation films of MOS transistors forming the DRAM are relatively increased in thickness and the absolute values of the threshold voltages of the MOS transistors are responsively increased beyond those of the MOS transistors included in logic circuit 2. When the memory circuit 3 is an SRAM, memory cells each have a flip-flop structure and have small leakage current. When the memory circuit 3 is a flash memory, a high voltage Vp for programming is used and hence the gate insulation films of MOS transistors forming the flash memory are increased in thickness beyond those of the MOS transistors forming the logic circuit 2, and the absolute values of the threshold voltages of the MOS transistors are relatively increased. In memory circuit 3, therefore, the subthreshold current in the standby state can be sufficiently suppressed.

The bit width of data bus 7, formed by internal interconnection lines, between logic circuit 2 and memory circuit 3 can be sufficiently increased for sufficiently increasing the bandwidth in data transfer between logic circuit 2 and memory circuit 3. Thus, the memory-embedded LSI 1 can operate at a high speed with low current consumption under a low power supply voltage.

When the sleep mode instruction signal SLP is inactivated, the data saved in memory circuit 3 are loaded onto the original positions of logic circuit 2 under the control of transfer control circuit 6. Even if supply of the operation power supply voltage VDDl to logic circuit 2 is stopped in the standby state and all internal data in logic circuit 2 disappear during the standby state, therefore, the logic circuit 2 can be recovered to the original state when restarting an operation. The logic power supply voltage VDDL is supplied again upon exit of the sleep mode. After exit of the sleep mode, therefore, next processing can be executed by transferring the data from memory circuit 3 to logic circuit 2.

Figure 2:
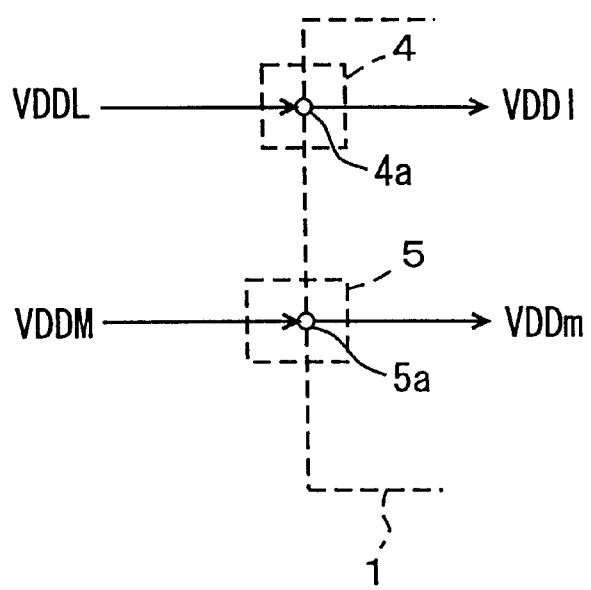
FIG. 2, schematically illustrates the structures of a logic power source and a memory power source shown in FIG. 1.

FIG. 2 illustrates exemplary structures of the logic power source 4 and the memory power source 5 shown in FIG. 1. Referring to FIG. 2, the logic power source 4 includes a pin terminal 4a receiving the externally supplied logic power supply voltage VDDL and generating the operation power supply voltage VDDl for logic circuit 2. The memory power source 5 includes a pin terminal 5a receiving the externally supplied memory power supply voltage VDDM and generating the operation power supply voltage VDDm for memory circuit 3. A system power source provided outside the memory-embedded LSI 1 generates the logic power supply voltage VDDL and the memory power supply voltage VDDM.

The power supply voltage for the memory-embedded LSI 1 can be readily controlled by simply stopping supply of the external logic power supply voltage VDDL in the standby state. The memory power source 5 may include a voltage down converter.

Figure 3:
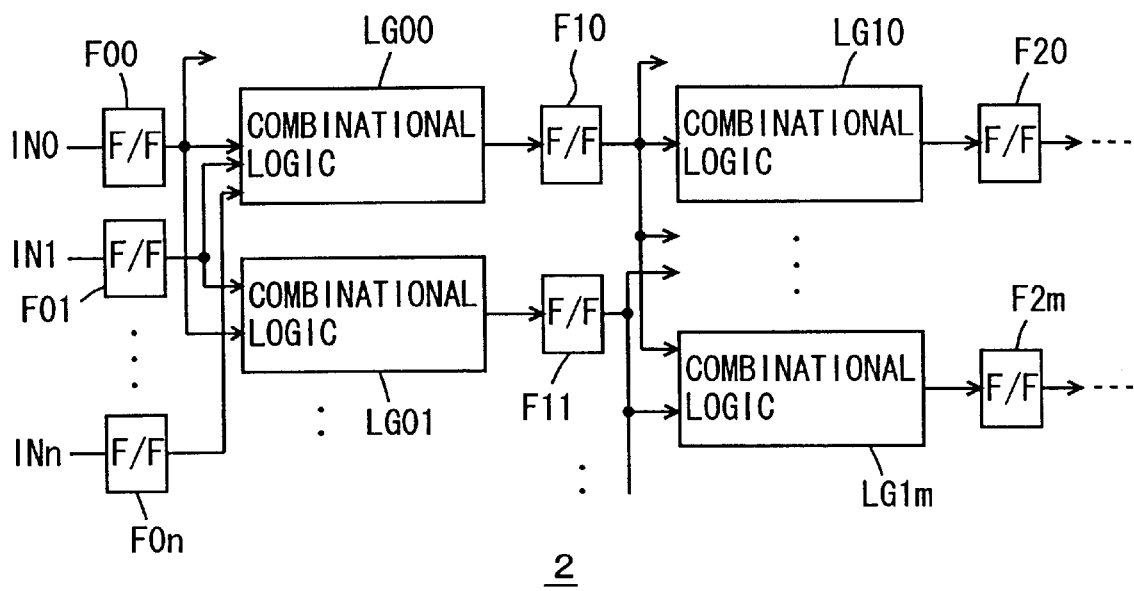
FIG. 3, schematically illustrates the structure of a logic circuit shown in FIG. 1.

FIG. 3 schematically illustrates a basic structure of logic circuit 2 shown in FIG. 1. Referring to FIG. 3, the logic circuit 2 includes flip-flops (F/F) F00 to F0n receiving input signals IN0 to INn respectively, combinational logic circuits LG00, LG01, . . . receiving output signals from prescribed combinations of flip-flops F00 to F0n respectively and performing prescribed processing, flip-flops (F/F) F10, F11, . . . receiving output signals from combinational logic circuits LG00, LG01, . . . respectively, combinational logic circuits LG10 to LG1m receiving output signals from prescribed combinations of flip-flops F10, F11, . . . and performing prescribed processing, and flip-flops (F/F) F20 to F2m receiving output signals from combinational logic circuits LG10 to LG1m respectively. As shown in FIG. 3, the logic circuit 2 includes a plurality of stages of combinational logic circuits, and the flip-flops (F/F) are provided between the respective stages.

Figure 4:
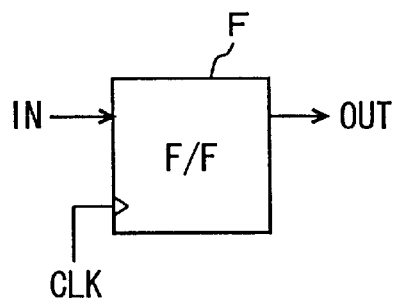
FIG. 4 schematically illustrates the structure of a flip-flop shown in FIG. 3.

FIG. 4 schematically illustrates the structure of each flip-flop (F/F) F shown in FIG. 3. As shown in FIG. 4, flip-flop (F/F) F latches an input signal IN in synchronization with rise of a clock signal CLK and outputs an output signal OUT. When the clock signal CLK goes low, flip-flop (F/F) F holds an output signal latched when the clock signal CLK was high and takes in a new input signal.

In logic circuit 2 shown in FIG. 3, therefore, each of combinational logic circuits LG00 to LG1m performs prescribed processing on signals supplied in synchronization with the clock signal CLK and outputs an output signal, so that the result of the processing is transferred through each flip-flop (F/F) F for further processing. The processing progresses synchronously with clock signal CLK in logic circuit 2, whereby no timing margin need be taken into consideration in each combinational logic circuit, and high-speed processing is implemented.

Figure 5:
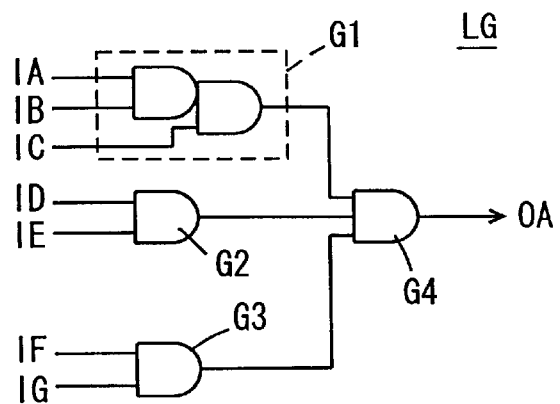
FIG. 5, illustrates an exemplary structure of a combinational logic circuit shown in FIG. 3.

FIG. 5 illustrates an exemplary structure of each combinational logic circuit LG shown in FIG. 3. Referring to FIG. 5, the combinational logic circuit LG includes an AND/AND composite gate G1 receiving input signals IA, IB and IC, an AND gate G2 receiving input signals ID and IE, an AND gate G3 receiving input signals IF and IG, and an AND gate G4 receiving output signals from the gates G1, G2 and G3 and generating an output signal OA.

AND/AND composite gate G1 functionally includes an AND gate receiving the input signals IA and IB and another AND gate receiving an output signal of that AND gate and the input signal IC.

In this combinational logic circuit LG, the logic state of the output signal OA is decided in accordance with the logic states of input signals IA to IG. FIG. 5 shows a mere exemplary structure of combinational logic circuit LG, which structure is properly determined depending on an application of memory-embedded LSI 1. The combinational logic circuit LG may have a structure having the logic state of a current output signal determined in accordance with logic states of currently supplied input signals.

Figure 6:
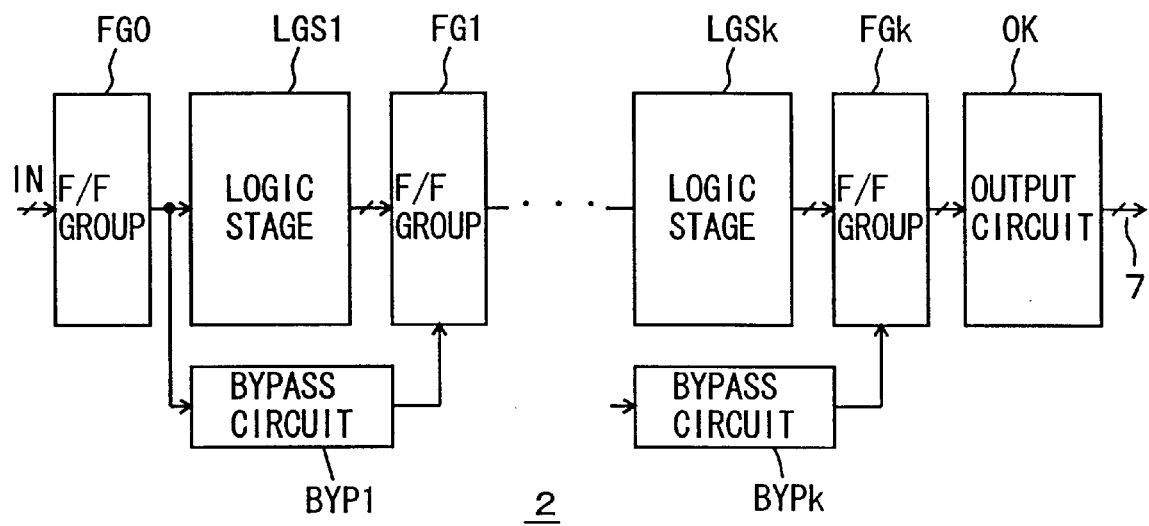
FIG. 6, schematically illustrates the overall structure of the logic circuit shown in FIG. 1.

FIG. 6 schematically illustrates the structure of logic circuit 2 in the first embodiment of the present invention. Referring to FIG. 6, logic circuit 2 includes (k+1) stages of flip-flop groups (F/F groups) FG0 to FGk, logic stages LGS1 to LGSk inserted between respective flip-flop groups FG0 to FGk, bypass circuits BYP1 to BYPk transferring output signals of flip-flop groups FG0 to FG(k−1) to next-stage flip-flop groups FG1 to FGk respectively in a transfer mode, and an output circuit OK receiving an output signal from the final-stage flip-flop group FGk and outputting the same onto data bus 7.

Each of flip-flop groups FG0 to FGk includes the same number of flip-flops (F/F). Each of logic stages LGS1 to LGSk includes at least one combinational logic circuit. The logic stages LGS1 to LGSk may process different numbers of input signals. In order to entirely transfer the maximum number of actually used input signals, each of flip-flop groups FG0 to FGk is provided with the same number of flip-flops (F/F), for sequentially transferring data in accordance with clock signal CLK or a transfer control clock signal in a sleep mode.

The output circuit OK outputs the output signal of flip-flop group FGk while adjusting the bit number thereof to match with the bit width of data bus 7. Data bits simultaneously output from output circuit OK are stored in memory circuit 3 in accordance with the same address. Therefore, address assignment of an internal data signal in logic circuit 2 is simplified for simplifying address control in data saving and data loading.

Figure 7:
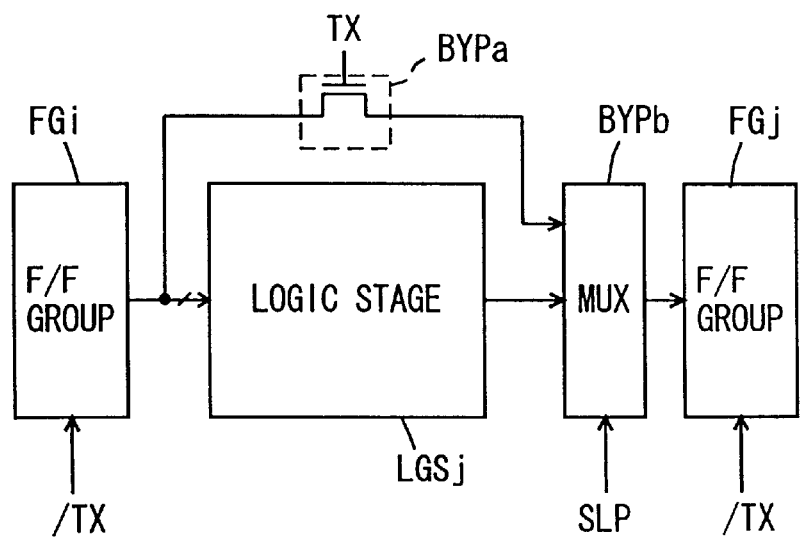
FIG. 7 schematically illustrates the structure of a single logic stage of the logic circuit according to the first embodiment of the present invention.

FIG. 7 illustrates the structure of flip-flop groups FGi and FGj provided on an input part and an output part of each logic stage LGSj. Referring to FIG. 7, the logic stage LGSj is arranged between flip-flop groups FGi and FGj. A transfer circuit BYPa transfers an output signal of flip-flop group FGi while bypassing logic stage LGSj. The logic stage LGSj is provided at an output part thereof with a multiplexer (MUX) BYPb selecting one of output signals of logic stage LGSj and transfer circuit BYPa. An output signal of multiplexer (MUX) BYPb is supplied to flip-flop group FGj. The transfer circuit BYPa and the multiplexer BYPb form a bypass circuit.

The transfer circuit BYPa is rendered conductive in accordance with a transfer control signal TX, and flip-flop groups FGi and FGj execute a transfer operation in accordance with a complementary transfer control signal/TX. The transfer control circuit 6 shown in FIG. 1 supplies the transfer control signals TX and/TX. The multiplexer (MUX) BYPb selects data transferred from transfer circuit BYPa when the sleep mode instruction signal SLP is active, and selects the output signal of logic stage LGSj when the sleep mode instruction signal SLP is inactive. The transfer circuit BYPa includes transfer gates (or transmission gates) provided for flip-flops included in flip-flop group FGi, respectively.

Figure 8:
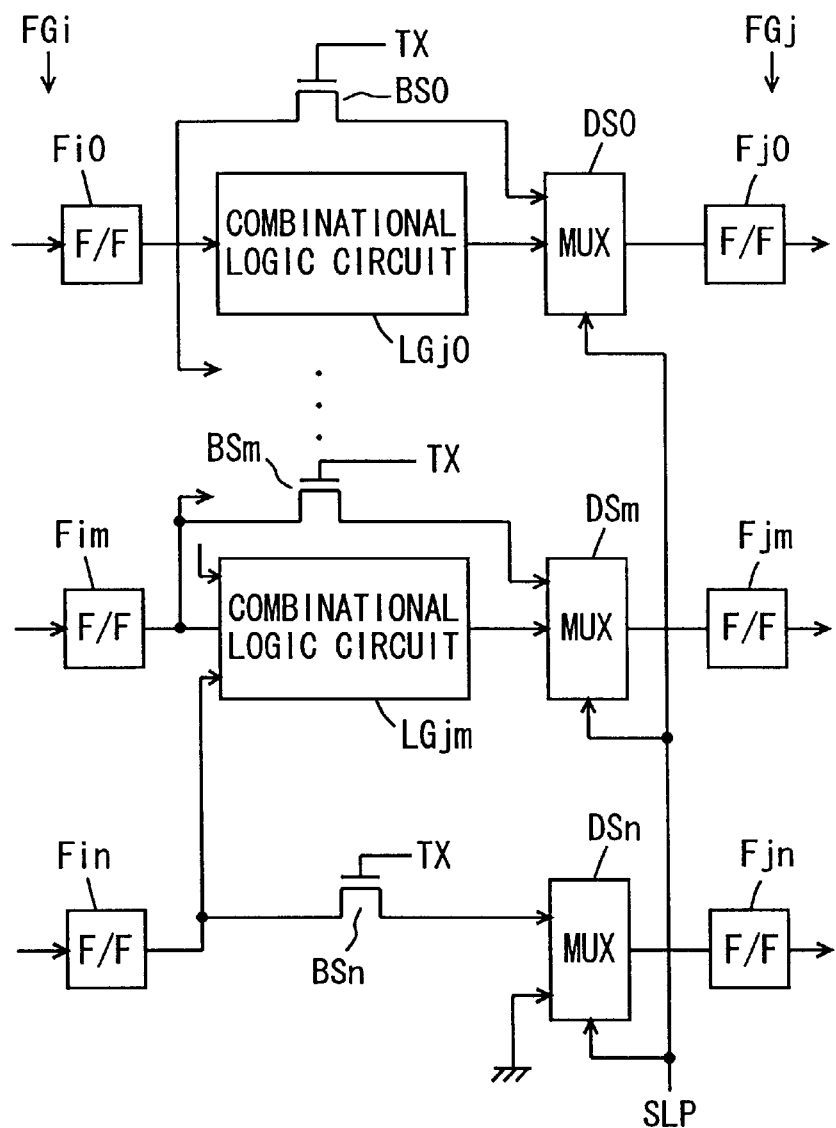
FIG. 8 schematically illustrates the structure of the logic circuit according to the first embodiment of the present invention.

FIG. 8 more specifically illustrates the structure shown in FIG. 7. Referring to FIG. 8, flip-flop group FGi includes flip-flops (F/F) Fi0 to Fin and flip-flop group FGj includes flip-flops Fj0 to Fjn.

The logic stage LGSj includes combinational logic circuits LGj0 to LGjm provided in correspondence to flip-flops Fi0 to Fim, respectively. Each of combinational logic circuits LGj0 to LGjm receives an output signal from a prescribed combination of flip-flops Fi0 to Fin.

The flip-flops Fj0 to Fjm are provided in correspondence to combinational logic circuits LGj0 to LGjm, respectively. No combinational logic circuit is provided in correspondence to flip-flop Fin. In correspondence to flip-flop Fin, flip-flop Fjn is provided in flip-flop group FGj. Also when flip-flop groups FGi and FGj have different numbers of flip-flops used for actual operation processing, data transfer from flip-flop group FGi to flip-flop group FGj is collectively executed in accordance with transfer control signal TX.

Transfer gates BS0 to BSm rendered conductive in response to transfer control signal TX are provided in correspondence to combinational logic circuits LGj0 to LGjm, respectively, and data selection circuits (MUX) DS0 to DSm are provided in correspondence to combinational logic circuits LGj0 to LGjm, respectively. Data selection circuits DS0 to DSm select output data of either the combinational logic circuits LGj0 to LGjm or the transfer gates BS0 to BSm in accordance with the sleep mode instruction signal SLP.

The data selection circuit DSn provided for flip-flop Fin receives output data from transfer gate BSn and data of a fixed logical level (ground voltage in FIG. 8). Output data from data selection circuit DSn is supplied to flip-flop Fjn.

Data transfer can be collectively executed between flip-flop groups FGi and FGj by providing a dummy flip-flop to equalize the number of flip-flops in each flip-flop group.

Figure 9:
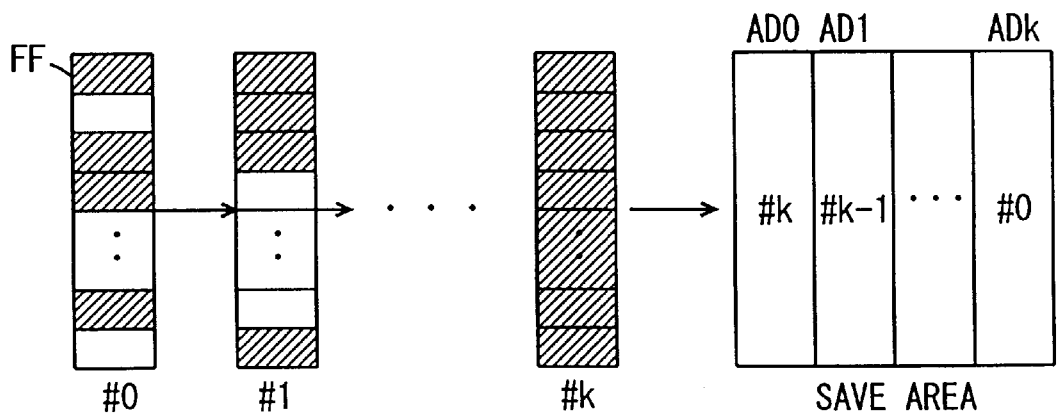
FIG. 9 schematically illustrates a data transfer sequence of the logic circuit according to the first embodiment of the present invention.

Referring to FIG. 9, consider that each of flip-flop groups #0 to #k includes the same number of flip-flops FF, and stores valid data in portions shown by oblique lines. Also in this case, each flip-flop group includes the same number of flip-flops and invalid data parts are sequentially transferred in accordance with transfer control signals TX and/TX. The output circuit OK (see FIG. 6) can store the data stored in flip-flop groups #0 to #k in a save area of memory circuit 3 in units of blocks of flip-flop groups #k, #k−1, ..., #0. Head addresses AD0, AD1, ..., ADk of the blocks can be generated with data transfer addresses in saving.

Figure 10:
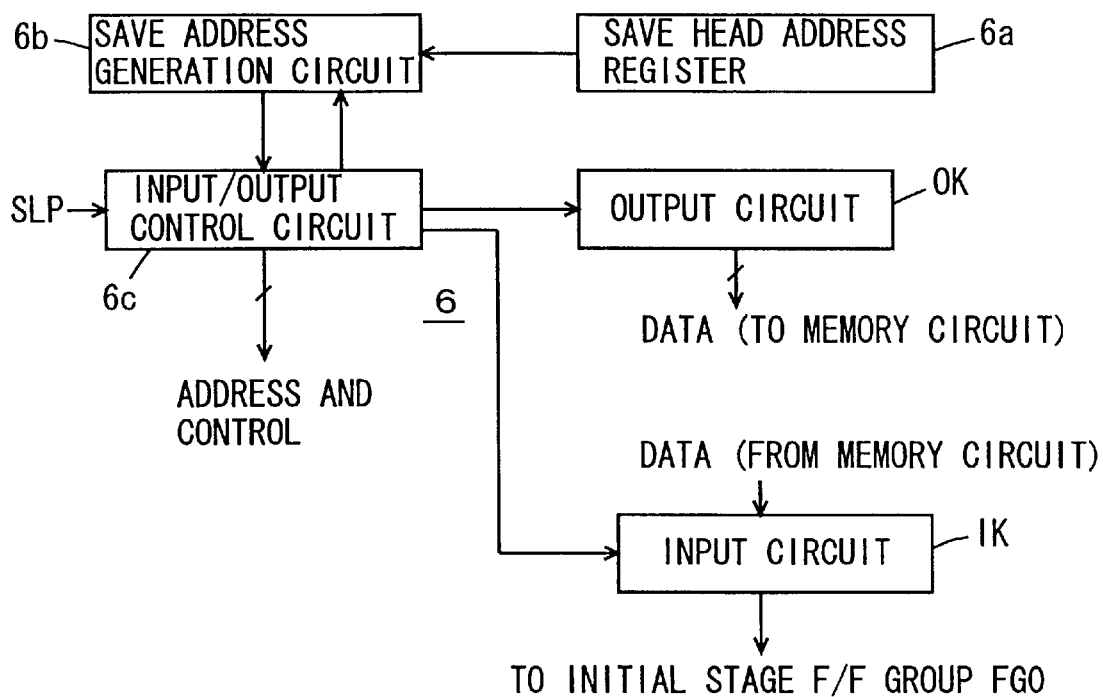
FIG. 10 schematically illustrates the structure of a transfer control circuit shown in FIG. 1.

FIG. 10 schematically illustrates the structure of transfer control circuit 6 shown in FIG. 1. Referring to FIG. 10, transfer control circuit 6 includes a save head address register 6a storing a save head address, a save address generation circuit 6b sequentially generating save addresses in accordance with the save head address from save head address register 6a, and an input/output control circuit 6c activating the save address generation circuit 6b in accordance with sleep mode instruction signal SLP, generating addresses and control signals for memory circuit 3 in accordance with the addresses supplied from save address generation circuit 6b, and controlling a data output operation of output circuit OK.

The save address generation circuit 6b sequentially generates the save addresses under the control of input/output control circuit 6c with the save head address from save head address register being the starting address 6a. The addresses are appropriately generated depending on the number of data held in logic circuit 2 and the bit width of data simultaneously transferable by output circuit OK. When memory circuit 3 can transfer data in a burst mode and the quantity of burst length data is larger than the quantity of the data held in logic circuit 2, for example, data can be saved by simply supplying only the save head address to memory circuit 3 and sequentially transferring the data to memory circuit 3.

The input/output control circuit 6c controls an operation of an input circuit IK when loading data into logic circuit 2 in exit of the sleep mode. In exit of the sleep mode, data must be loaded from memory circuit 3, and input/output control circuit 6c generates addresses for memory circuit 3 and generates control signals necessary for data reading in accordance with the save addresses from save address generation circuit 6b.

When receiving data from memory circuit 3, input circuit IK adjusts the bit width of the input data to match with the number of the flip-flops included in flip-flop groups FG0 to FGk and supplies the data to the initial-stage flip-flop group FG0 in parallel.

The save head address register 6a is simply required to store the save head address, and is not required to operate at a high speed. Therefore, save head address register 6a is formed of a MOS transistor having a large absolute value of the threshold voltage for suppressing the subthreshold leakage current thereof. The input/output control circuit 6c must monitor the sleep mode instruction signal SLP. Therefore, save head address register 6a and input/output control circuit 6c are regularly supplied with operation power supply voltages.

The transfer control circuit 6 is only required to be formed in the semiconductor integrated circuit device 1, and hence, save head address register 6a may be arranged in memory circuit 3 or in logic circuit 2. Therefore, save head address register 6a may adapted to be provided in memory circuit 3 to be regularly supplied with the power supply voltage. The save head address may be fixedly determined.

When the data save area in the sleep mode is dynamically determined for saving the data only to a free address area in memory circuit 3, memory circuit 3 may be provided with a register storing the head address of the free area for storing a free area head address from the free area head address storage register in memory circuit 3 into save head address register 6a in the data transfer operation for transition to the sleep mode under the control of input/output control circuit 6c.

Figure 11:
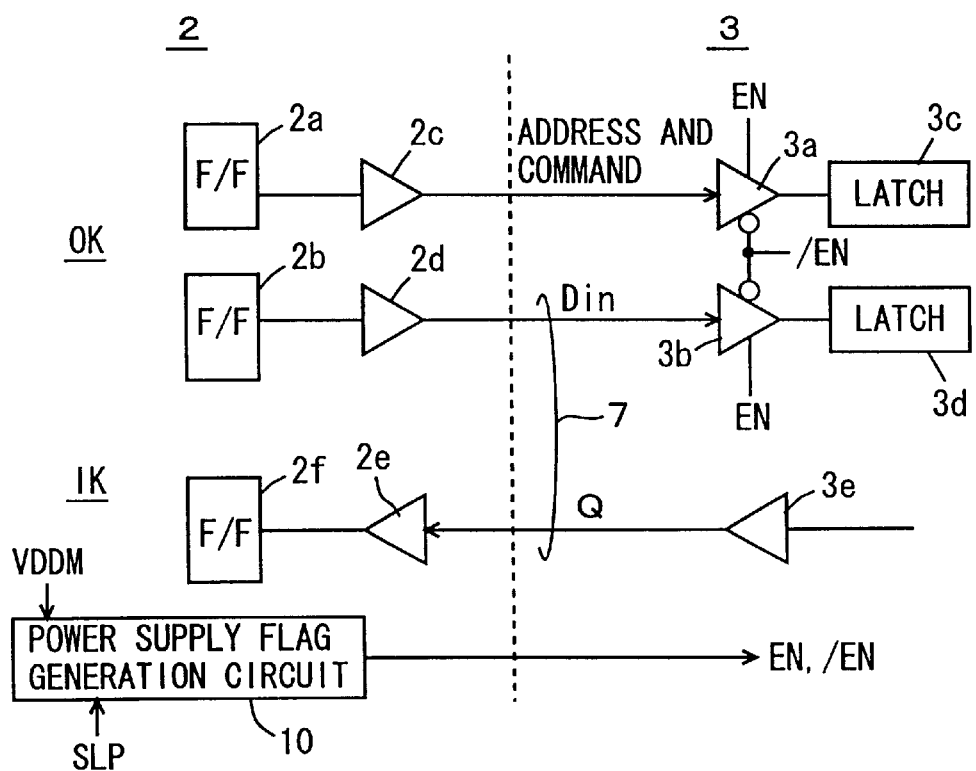
FIG. 11 schematically illustrates the structure of an interface part between the logic circuit and the memory circuit of the semiconductor integrated circuit device according to the first embodiment of the present invention.

FIG. 11 schematically illustrates the structure of an interface part between the logic circuit 2 and memory circuit 3.

Referring to FIG. 11, the logic circuit 2 includes output circuit OK and input circuit IK. The output circuit OK includes flip-flops (F/F) 2a and 2b transferring data/signals supplied in synchronization with a clock signal (not shown) and output buffer circuits 2c and 2d buffering output signals from flip-flops 2a and 2b and supplying the buffered output signals to memory circuit 3. The output buffer circuit 2c outputs addresses and commands, and the output buffer circuit 2d outputs write data D for memory circuit 3.

The input circuit IK includes an input buffer circuit 2e receiving data Q read from memory circuit 3 and a flip-flop 2f transferring output data of input buffer circuit 2e in synchronization with the clock signal (not shown). FIG. 11 shows data D and Q being transferred between logic circuit 2 and memory circuit 3 through different buses, respectively. However, data D and Q may alternatively be transferred through the same bus.

The memory-embedded LSI 1 is provided with a power supply flag generation circuit 10 generating power supply flags EN and /EN in accordance with sleep mode instruction signal SLP. The power supply flag generation circuit 10 receives the memory power supply voltage VDDM as one operation power supply voltage.

The interface part of memory circuit 3 includes a tri-state buffer 3a receiving output signals (addresses and commands) from output buffer circuit 2c of logic circuit 2, a tri-state buffer 3b receiving the output data D from output buffer circuit 2d of logic circuit 2, a latch circuit 3c latching an output signal of tri-state buffer 3a and a latch circuit 3d latching output data from tri-state buffer 3b. The tri-state buffers 3a and 3b enter output high impedance states when power supply flags EN and /EN from power supply flag generation circuit 10 are inactive to indicate that the supply of power supply voltage VDD1 for logic circuit 2 is stopped.

The memory circuit 3 further includes an output buffer circuit 3e for transferring data to logic circuit 2. FIG. 11 illustrates output buffer circuit 3e as a regularly operating buffer circuit. However, the output buffer circuit 3e is activated in accordance with an output enable signal activated upon data output in memory circuit 3.

In the sleep mode, supply of power supply voltage VDD1 to logic circuit 2 is stopped. Therefore, the output signals of output buffer circuits 2c and 2d may enter floating states. When the output signals from output buffer circuits 2c and 2d become instable due to influence by noise or the like, through currents may flow in tii-state buffers 3a and 3b. The tristate buffers 3a and 3b are provided in order to prevent generation of through currents in memory circuit 3 resulting from electrical floating of the output signals from logic circuit 2 caused when supply of power supply voltage VDD1 to logic circuit 2 is stopped. In the sleep mode, power supply flags EN and /EN are inactivated and tri-state buffers 3a and 3b enter output high impedance states. The memory circuit 3 is formed of MOS transistors having relatively large absolute values of the threshold voltages. When tri-state buffers 3a and 3b are set in the output high impedance states, subthreshold leakage currents thereof are extremely small and increase of current consumption by through currents can be prevented.

The power supply flag EN can be generated by inverting the sleep mode instruction signal SLP after completion of data saving.

According to the first embodiment of the present invention, as hereinabove described, data held in logic circuit 2 are transferred to and stored in memory circuit 3 and thereafter supply of power supply voltage VDD1 to logic circuit 2 is stopped in the standby state of memory-embedded LSI 1, whereby current consumption in the standby state can be reduced. Further, logic circuit 2 can be formed of MOS transistors having low threshold voltages, so that memory-embedded LSI 1 can operate at a high speed.

[Second Embodiment]

FIGS. 12A and 12B illustrate operation sequences of a memory-embedded LSI according to a second embodiment of the present invention. FIG. 12A shows an operation sequence in a power-down operation cutting off a power supply voltage for a logic circuit, and FIG. 12B shows a sequence in an operation of applying power to the logic circuit again.

Referring to FIG. 12A, an external system processor (main processor) first signals the shut down of power (power-off). The system processor signals the logic circuit of shut down of power by activating a sleep mode instruction signal SLP, for example. When the logic circuit is supplied with a command instructing shut down of power, data of flip-flops (F/F) are transferred to the memory circuit under the control of a transfer control circuit along a sequence similar to that shown in the first embodiment. The memory circuit writes the data transferred from the logic circuit under the control of the transfer control circuit, to save the data of the logic circuit.

When the data transfer from the flip-flops (F/F) of the logic circuit is terminated (the transfer control circuit detects this termination), the power supply flag generation circuit 10 shown in FIG. 11 inactivates the power supply flags EN and /EN for setting an interface part of the memory circuit in an output high impedance state and preventing generation of through currents.

When power supply flags EN and /EN are inactivated, the transfer control circuit signals the system processor of termination of transfer by a system command, so that supply of a logic power supply voltage VDDL is stopped under the control of the system processor.

Thereafter the memory-embedded LSI enters a power-down mode (sleep mode), and supply of the power supply voltage to the logic circuit is stopped. The memory circuit holds the saved data. When formed of a DRAM, the memory circuit refreshes the held data (saved data) in a prescribed cycle.

Description is now made on an operation sequence in exit of the power-down mode (sleep mode) and applying power to the memory-embedded LSI for accessing the memory-embedded LSI again with reference to FIG. 12B.

First, the logic power supply voltage VDDL is supplied under the control of the system processor (not shown), which in turn supplies a wakeup command and signals the logic circuit of the supply of logic power supply voltage VDDL. This wakeup command is signaled by inactivating the sleep mode instruction signal SLP, for example. In the memory-embedded LSI, power supply flag generation circuit 10 activates the power supply flags EN and /EN in response to this inactivation of sleep mode instruction signal SLP, for releasing the interface part of the memory circuit from an output high impedance state.

Then, the logic circuit releases the power supply flags EN and /EN from a power-off instructing state and thereafter accesses the memory circuit under the control of the transfer control circuit, for reading the saved data of the flip-flops (F/F) from the memory circuit. The saved data read from the memory circuit are sequentially transferred in the logic circuit through flip-flop groups, to restore the logic circuit to the state before transition to the power-down mode. When the operation of transferring the saved data is completed, the memory-embedded LSI waits for a command from the system processor (not shown).

The transfer control circuit 6 and the power supply flag generation circuit 10 shown in the first embodiment execute the series of operations shown in FIGS. 12A and 12B.

According to the second embodiment of the present invention, as hereinabove described, the power supply flags EN and /EN are employed for bringing the interface part of the memory circuit into the output high impedance state in the power-down mode while enabling the interface part of the memory circuit and thereafter reading data from the memory circuit in the wakeup operation. Therefore, operations of the interface part of the memory circuit can be reliably controlled with the flags EN and /EN for correctly saving data from the logic circuit and loading the data again.

[Third Embodiment]

FIG. 13 schematically illustrates the structure of a memory circuit 3 of a memory-embedded LSI according to a third embodiment of the present invention. Referring to FIG. 13, the memory circuit 3 is formed by a DRAM. The memory circuit 3 includes a memory array 13 having a plurality of dynamic memory cells arranged in rows and columns. The memory array 13 is divided into a plurality of memory blocks 14 each having a plurality of memory cells arranged in rows and columns. Sense amplifiers 15 are arranged between memory blocks 14 for sensing and amplifying memory cell data on the columns of corresponding memory blocks 14. FIG. 13 representatively shows a single memory block 14 and a single sense amplifier 15.

The memory circuit 3 further includes a row decoder 16 for driving an addressed row of memory array 13 to a selected state in accordance with a supplied row address signal, a column decoder 17 for selecting an addressed column of memory array 13 in accordance with a supplied column address signal and a preamplifier/write driver 18 for reading and writing data from and in a memory cell of memory array 13 selected by row decoder 16 and column decoder 17. The preamplifier included in preamplifier/write driver 18 amplifies the data of a selected memory cell of memory array 13 and transmits the amplified data to an output buffer 19. The write driver included in preamplifier/write driver 18 is coupled to a data-in buffer 20 for buffering data supplied from data-in buffer 20 and transmitting write data to a selected memory cell of memory array 13. The output buffer 19 transfers read data Q to a logic circuit through a data output node 21, and the data-in buffer 20 buffers input data D supplied from the logic circuit through a data input node 22.

The memory circuit 3 further includes a refresh timer 25 time-measuring a refresh cycle, a refresh address counter 26 generating a refresh address in accordance with a refresh request from refresh timer 25, a multiplexer 28 selecting one of an address signal supplied from an address input node 23 and a refresh address from refresh address counter 26 under the control of an arbiter circuit 27, a row address buffer 29 buffering the address signal supplied through multiplexer 28, generating an internal row address signal and supplying the same to row decoder 16, a column address buffer 30 taking in and buffering a column address supplied from address input node 23, generating an internal column address signal and supplying the same to column decoder 17, a row control circuit 32 controlling an operation related to row selection in accordance with a control signal supplied to a control signal node 31, a column control circuit 33 controlling an operation related to column selection in accordance with a control signal supplied from control signal node 31, and a read/write control circuit 34 controlling an operation related to data writing/reading in accordance with a control signal supplied to control signal node 31.

When memory circuit 3 is in a refresh mode and performs a refresh operation, arbiter circuit 27 stops external access up to completion of the refresh operation. When refresh timer 25 outputs a refresh request, arbiter circuit 27 supplies a wait signal to a system processor for interrupting processing and executing refresh. Therefore, setting of a connection path of multiplexer 28 and the operation of row control circuit 32 is controlled under the control of arbiter circuit 27. The row control circuit 32 performs row selection in accordance with a refresh instruction from arbiter circuit 27.

The refresh timer 25 time-measures refresh cycles in both a normal mode and a self refresh mode.

The row control circuit 32 activates the operation related to row selection when a command (a row access command or an active command) instructing array activation is supplied to control signal node 31. The activation of row decoder 16 and the sense amplifier 15 and an operation of a bit line precharge circuit included in memory array 13 are controlled under the control of row control circuit 32.

The column control circuit 33 is activated when a command instructing data writing or reading is supplied, to activate circuits related to column selection. The column decoder 17 operates under the control of column control circuit 33. However, column control circuit 33 is set in an operable state after row-related circuits operate under the control of row control circuit 32 (this corresponds to a period referred to as a column interlock period in a standard DRAM, as described later).

When a read command instructing data reading is supplied, read/write control circuit 34 activates the preamplifier of preamplifier/write driver 18 and output buffer 19. When a write command instructing data writing is supplied, read/write control circuit 34 activates the data-in buffer 20 and the write driver.

In the structure shown in FIG. 13, the row-related circuits related to row selection are represented by blocks shown by oblique lines and includes sense amplifier 15, row decoder 16, refresh timer 25, refresh address counter 26, row address buffer 29, arbiter circuit 27 and row control circuit 32. These circuits must operate for executing refresh of memory cell data in a sleep mode.

In a refresh operation, only memory cell data is read, amplified and restored in memory array 13 with no column selection. Therefore, the circuits related to column selection, i.e., column decoder 17, preamplifier/write driver 18, output buffer 19, data-in buffer 20, column address buffer 30, column control circuit 33 and read/write control circuit 34 may not operate in the sleep mode and hence, supply of a power supply voltage to the column-related circuits is stopped in the sleep mode. Thus, a standby current in memory circuit 3 can be reduced for implementing a memory-embedded LSI having lower current consumption.

Figure 14:
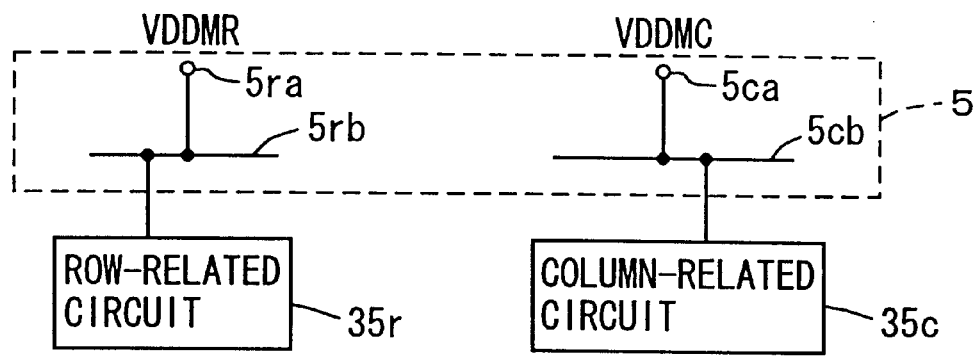
FIG. 14 schematically illustrates the structure of a memory power supply circuit according to the third embodiment of the present invention.

FIG. 14 schematically illustrates the structure of a memory power source 5 in the third embodiment of the present invention. Referring to FIG. 14, the memory power source 5 includes a power supply node 5ra receiving an externally supplied row-related memory power supply voltage VDDMR, a row-related power supply line 5rb coupled to power supply node 5ra for transmitting an internal power supply voltage to a row-related circuit 35r, a power supply node 5ca receiving an external column-related memory power supply voltage VDDMC and a column-related power supply line 5cb transmitting a power supply voltage to a column-related circuit 35c.

In the structure of memory power source 5 shown in FIG. 14, supply of the column-related power supply voltage VDDMC is stopped after completion of data transfer in a power-down mode (sleep mode). The row-related memory power supply voltage VDDMR is continuously supplied also in the power-down mode (sleep mode). In the structure shown in FIG. 14, supply of column-related memory power supply voltage VDDMC is stopped under the control of a system processor (not shown). In memory circuit 3, supply of the operation power supply voltage to column-related circuit 35c is simply stopped to disable the column-related circuit 35c, and control of the power supply voltage is simplified. In the power-down mode, the sleep mode is designated so that application of power is actually stopped.

Figure 15:
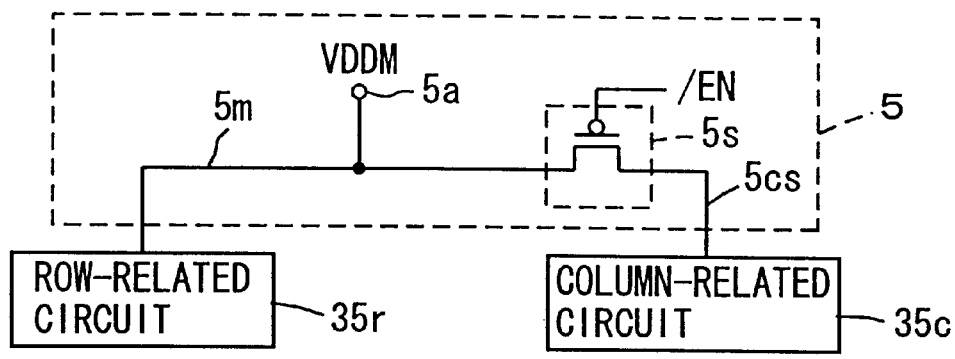
FIG. 15 schematically illustrates another structure of the memory power supply circuit according to the third embodiment of the present invention.

FIG. 15 illustrates another structure of memory power source 5 in the third embodiment of the present invention. Referring to FIG. 15, memory power source 5 includes a power supply node 5a receiving an external memory power supply voltage VDDM, a main power supply line 5m transmitting a power supply voltage supplied from power supply node 5a to a row-related circuit 35r and a column power supply line 5cs connected to main power supply line 5m through a switching transistor 5s. The voltage on column power supply line 5cs is supplied to a column-related circuit 35c as an operation power supply voltage.

The switching transistor 5s selectively connects the main power supply line 5m and the column power supply line 5cs with each other in response to a power supply flag /EN. In the sleep mode (power-down mode), power supply flag /EN is set high, switching transistor 5s is rendered non-conductive, and column power supply line 5cs is disconnected from main power supply line 5m. The main power supply line 5m and the column power supply line 5cs can be electrically disconnected from each other with no influence by a subthreshold leakage current by increasing the absolute value of a threshold voltage of switching transistor 5s. When supply of the power supply voltage is stopped, column power supply line 5cs is rapidly discharged to a ground voltage level by discharge through the column-related circuit 35c.

Figure 16:
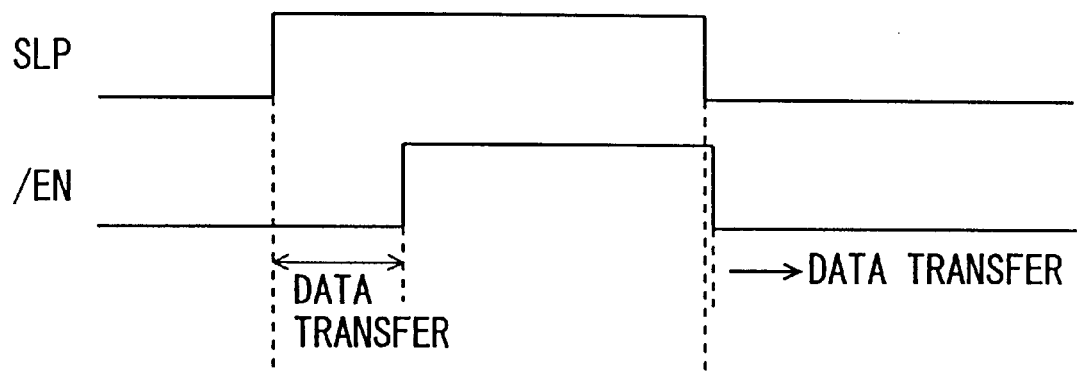
FIG. 16 is a signal waveform diagram representing operations in the third embodiment of the present invention.

In the structure shown in FIG. 15, power supply flag /EN goes high after disconnection of power is signaled, a sleep mode instruction signal SLP is activated and data are completely transferred from the logic circuit to memory circuit 3, as described above with reference to the second embodiment. When the sleep mode is escaped, power supply flag /EN is activated in accordance with inactivation of sleep mode instruction signal SLP. As shown in FIG. 16, therefore, data transfer is performed during the low-level period of power supply flag /EN for saving and loading the data of the logic circuit, and the column-related circuit 35c operates in memory circuit 3. During this period, switching transistor 5s is in an ON state in accordance with power supply flag /EN, to connect the column power supply line 5cs to main power supply line 5m. Therefore, the power supply voltage can be regularly supplied to the row-related circuit 35r while stopping supply of the power supply voltage to column-related circuit 35c in the sleep mode by simply providing the switching transistor 5s for power supply lines 5cs and 5m. In this case, only the memory power supply voltage VDDM is externally supplied and the number of power supply terminals can be reduced.

Figure 17:
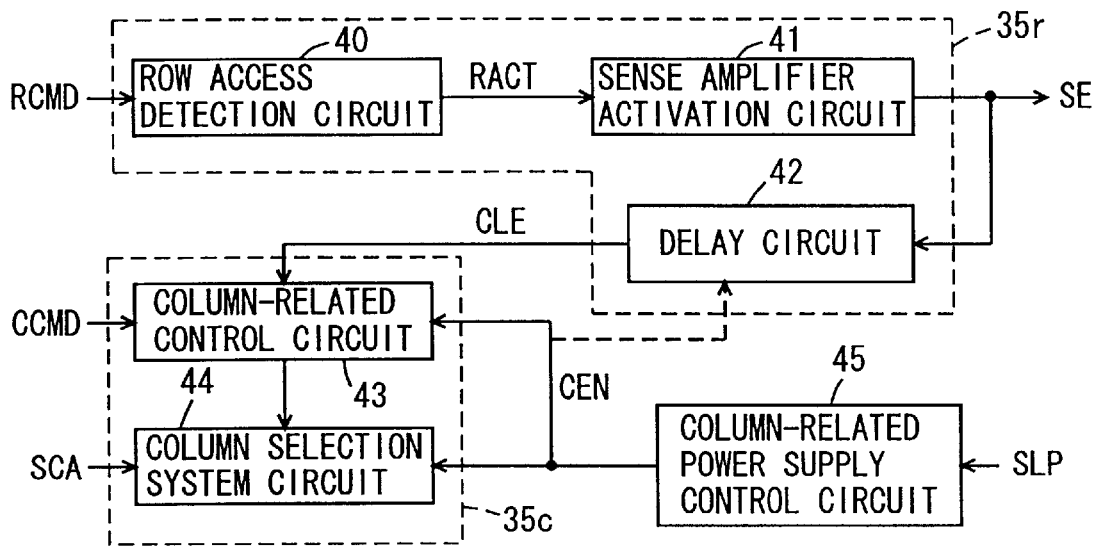
FIG. 17 schematically illustrates the structure of a main part of the semiconductor integrated circuit device according to the third embodiment of the present invention.

FIG. 17 schematically illustrates the structures of the row-related circuit 35r and the column-related circuit 35c in the third embodiment of the present invention. Referring to FIG. 17, the row-related circuit 35r includes a row access detection circuit 40 detecting an instruction for row access in accordance with an externally supplied row access instruction command RCMD and outputting an array activation signal RACT, a sense amplifier activation circuit 41 outputting a sense amplifier activation signal SE in accordance with array activation signal RACT from row access detection circuit 40, and a delay circuit 42 delaying the sense amplifier activation signal SE and outputting a column enable signal CLE.

When memory circuit 3 is a DRAM, the operation of the column-related circuit 35c is stopped until the row-related circuit 35r operates and the sense amplifier 15 amplifies and latches memory cell data. The period when the operation of the column-related circuit 35c is stopped is generally referred to as a column interlock period. The operation of column-related circuit 35c is inhibited until sense amplifier activation signal SE is activated and sense amplifier 15 latches and stabilizes the memory cell data even if a column access instruction signal is supplied, thereby preventing instable reading of the memory cell data.

The column-related circuit 35c includes a column-related control circuit 43 activated when the column enable signal CLE from delay circuit 42 is activated, for controlling the operation related to column selection in accordance with a column access instruction command CCMD, and a column selection related circuit 44 operating under the control of column-related control circuit 43 for performing prescribed processing in accordance with an externally supplied column-related signal SCA. The column-related signal SCA includes input/output data and a column address signal.

A column-related power supply control circuit 45 generating a column-related power supply enable signal CEN in accordance with sleep mode instruction signal SLP and supplying the same to column-related control circuit 43 and column selection related circuit 44 is provided for column-related circuit 35c. When column-related power supply enable signal CEN from column-related power supply control circuit 45 is activated, output signals of column-related control circuit 43 and column selection related circuit 44 are set to fixed logical values. Thus, supply of the power supply voltage to column-related circuit 35c is stopped for preventing the column-related circuit 35c from causing a flow of a through current and from malfunctioning under an instable column-related power supply voltage when the power supply voltage is instable.

Figure 18A:
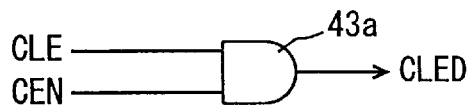
FIG. 18A illustrates the structure of a input part of a column-related control circuit shown in FIG. 17.

FIG. 18A illustrates an exemplary structure of the column-related control circuit 43. Referring to FIG. 18A, column-related control circuit 43 includes an AND circuit 43a receiving a column enable signal CLE and a column-related power supply enable signal CEN. A column selection activation signal CLED from AND circuit 43a enables column selection of column-related control circuit 43.

Figure 18B:
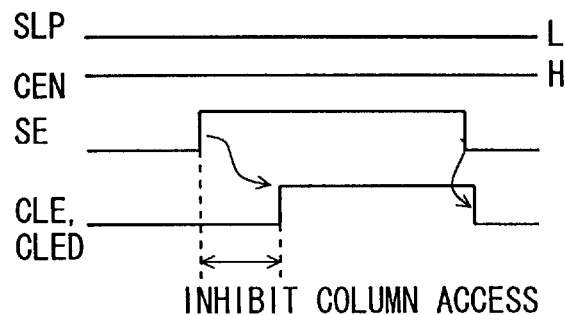
FIG. 18B is a signal waveform diagram representing operations of the circuit shown in FIG. 17.

FIG. 18B is a signal waveform diagram representing operations of column-related control circuit 43 in a normal operation mode. Referring to FIG. 18B, the sleep mode instruction signal SLP is in an inactive state of a low level and column-related power supply enable signal CEN is responsively in an active state of a high level in the normal operation mode. When sense amplifier activation signal SE is activated, therefore, column enable signal CLE and column selection activation signal CLED from AND circuit 43a are activated after a lapse of the delay time of delay circuit 42. The period between activation of sense amplifier activation signal SE and activation of column enable signal CLE is generally referred to as a column interlock period when column selection (column access) is inhibited even if a column access instruction command is supplied.

Figure 18C:
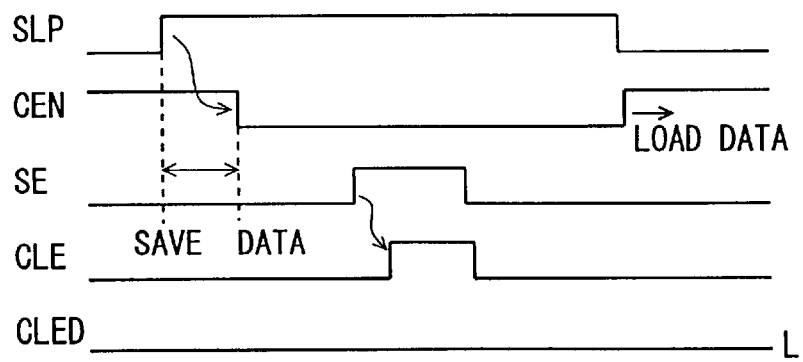
FIG. 18C is a signal waveform diagram representing operations of a memory circuit in a sleep mode in the third embodiment of the present invention.

As shown in FIG. 18C, the sleep mode instruction signal SLP is driven to an active state of a high level in the sleep mode. When sleep mode instruction signal SLP is activated, column-related power supply enable signal CEN from column-related power supply control circuit 45 enters an inactive state and goes low after data held in the logic circuit are saved to memory circuit 3, and column selection activation signal CLED from AND circuit 43*a* shown in FIG. 18A is responsively fixed to an inactive state of a low level. Thus, column-related circuit 35*c* is inhibited of column selection.

When supply of column-related power supply voltage is stopped in the sleep mode, column-related power supply enable signal CEN is fixed low and column selection activation signal CLED is also fixed low even if supply of the power supply voltage to AND circuit 43*a* is stopped to render the logical level of output signal CLED thereof instable. Thus, the column-related control circuit 43 is prevented from causing a through current resulting from signal floating-up caused by noise or the like.

Figure 19:
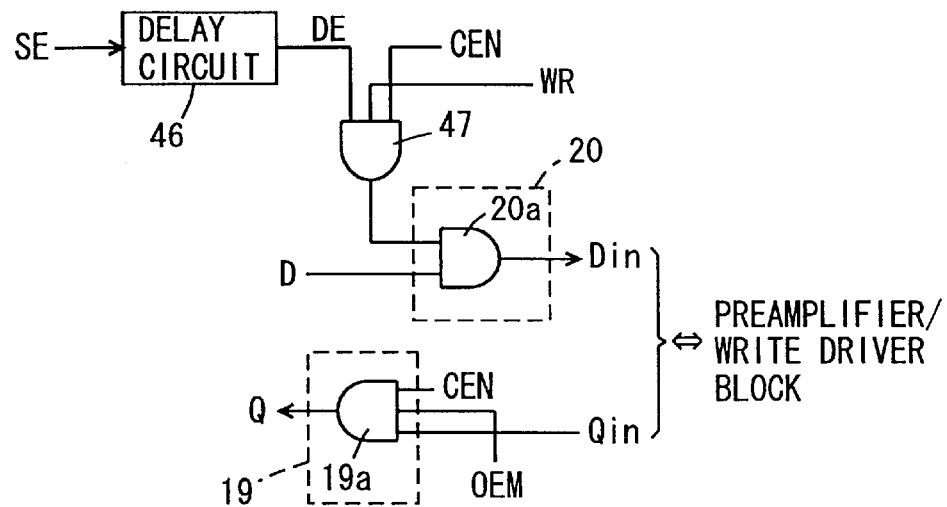
FIG. 19 schematically illustrates the structure of a data input/output part according to the third embodiment of the present invention.

FIG. 19 schematically illustrates the structure of a data input/output part of the column-related circuit 35*r* according to the third embodiment of the present invention. Referring to FIG. 19, a delay circuit 46 delays the sense amplifier activation signal SE to generate a data enable signal DE. When data enable signal DE from delay circuit 46 is activated, this DRAM can take in write data in accordance with an external write instruction.

In order to control this data writing, an AND circuit 47 is provided to receive the data enable signal DE, the column-related power supply enable signal CEN and a write instruction signal WR. A buffer circuit 20*a* included in data-in buffer 20 is enabled in accordance with an output signal of AND circuit 47, to take in external data D and generate internal data Din.

The write instruction signal WR is generated in accordance with a write command instructing data writing, for example.

The output buffer circuit 19 includes a buffer circuit 19*a* receiving an output enable signal OEM, column-related power supply enable signal CEN and internal read data Qin. Output data Q from buffer circuit 19*a* is supplied to the logic circuit. When supply of the power supply voltage to column-related circuit 35*c* is stopped, output data D and Q from buffer circuits 19*a* and 20*a* are prevented from entering floating states, thereby preventing an instable internal operation caused by instable internal write data Din.

In the structure shown in FIG. 19, data-in buffer 20 may be replaced with a column address buffer taking in the column address signal. In column-related circuit 35*c*, the logical level of the output signal from each circuit is fixed in the sleep mode. Thus, even if the row-related circuit 35*r* operates for a refresh operation and the logical level of an output signal from a row-related control circuit changes, the logical level of the output signal from column-related circuit 35*c* is fixed and a malfunction can be prevented.

Figure 20:
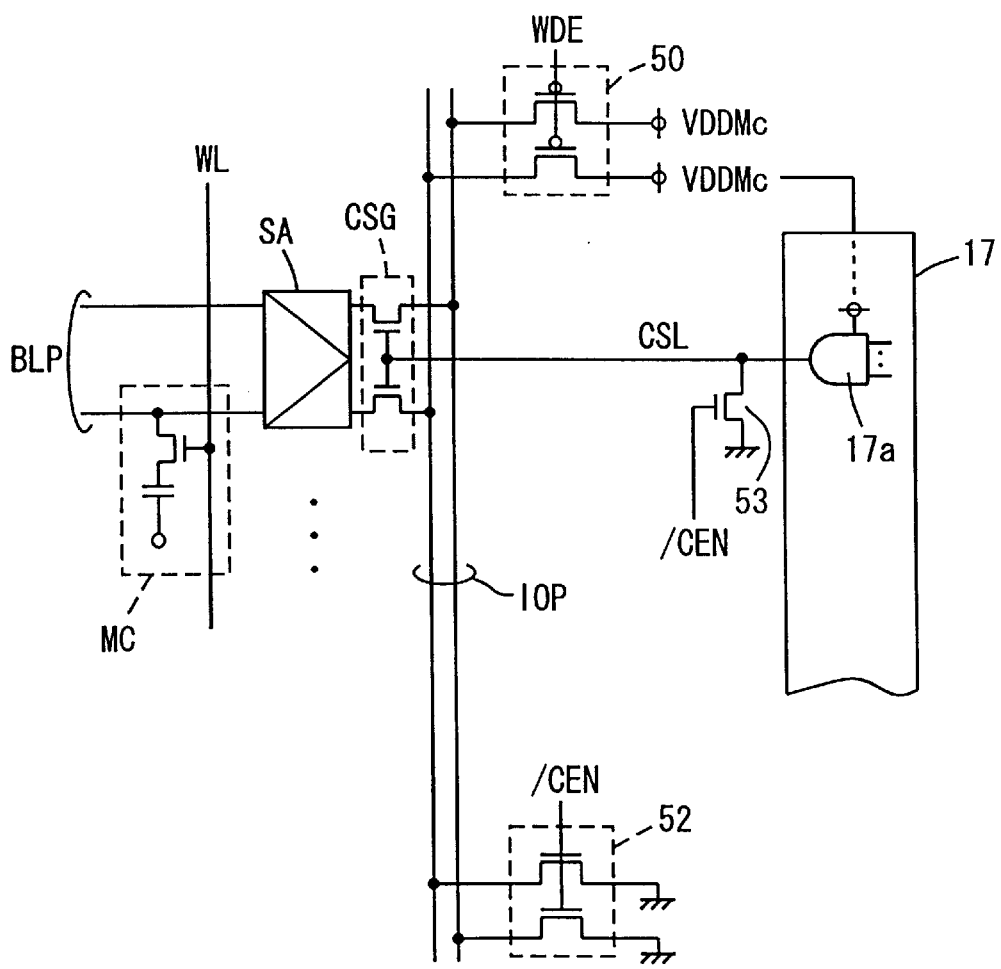
FIG. 20 schematically illustrates the structure of an interface part between an array part of a memory circuit and a column-related circuit according to the third embodiment of the present invention.

FIG. 20 schematically illustrates the structure of an interface part between memory array 13 and column-related circuit 35*c* in the DRAM according to the third embodiment of the present invention. Referring to FIG. 20, a memory cell MC is arranged in correspondence to the intersection between a pair of bit lines BLP and a word line WL. The memory cell MC is a dynamic memory cell, and includes a capacitor and an access transistor. A sense amplifier circuit SA is provided for the pair of bit lines BLP. The sense amplifier circuit SA, forming the row-related circuit 35*r*, is activated in a prescribed cycle for refreshing data stored in the memory cell MC in the sleep mode.

The sense amplifier circuit SA is coupled to a pair of internal data lines IOP through a column selection gate CSG. An I/O line precharge circuit 50 transmitting a column-related power supply voltage VDDMc to each of the pair of internal data lines IOP when activated is provided for the pair of internal data lines IOP. The I/O line precharge circuit 50 is rendered non-conductive when a write driver enable signal WDE is activated in data writing or otherwise rendered conductive, and transmits the column-related power supply voltage VDDMc to each of the pair of internal data lines IOP when made conductive. The column-related power supply voltage VDDMc may be any of the voltages VDDMC and VDDM and a down-converted voltage.

The column selection gate CSG is selectively rendered conductive in accordance with a column selection signal CSL from a column decode circuit 17*a* included in column decoder 17. The column decoder 17 (column decode circuit 17*a*) operates receiving the column-related power supply voltage VDDMc as one operation power supply voltage.

Supply of the column-related power supply voltage VDDMc is stopped in the sleep mode. Thus, there is a possibility that the pair of internal data lines and the column selection line CSL enter floating states, the column selection gate CSG is rendered conductive and current flows from the pair of bit lines BLP to the pair of internal data lines IOP. Therefore, an internal data line reset circuit 52 rendered conductive in accordance with an inverted signal /CEN of the column-related power supply enable signal CEN is provided for the pair of internal data lines IOP, and a reset MOS transistor 53 rendered conductive in response to the complementary column-related power supply enable signal /CEN is provided for each output line (column selection line) from column decoder 17.

In the normal operation mode, the complementary column-related power supply enable signal /CEN is low, each MOS transistor of internal data line reset circuit 52 is non-conductive, and the reset MOS transistor 53 is also non-conductive.

In the sleep mode, the complementary column-related power supply enable signal /CEN goes low, each MOS transistor included in reset circuit 52 and the reset MOS transistor 53 are turned on, and the column selection line CSL and the pair of internal data lines IOP are fixed to the ground voltage level. When supply of the column related power supply voltage VDDMc is stopped, therefore, the column selection line CSL and the pair of internal data lines IOP can be prevented from entering floating states. Thus, when sense amplifier circuit SA operates in the refresh operation, it is possible to prevent the voltage level of the column selection signal on column selection line CSL from increasing to turn on column selection gate CSG to feed current from the pair of bit lines BLP to the pair of internal data lines.

When a bit line precharge/equalize circuit (not shown) precharges the pair of bit lines BLP to an intermediate voltage level in a standby state, it is possible to prevent the voltage level on column selection line CSL from increasing to turn on column selection gate CSG to feed current from the pair of bit lines BLP to the pair of internal data lines IOP.

Referring to FIG. 20, reset MOS transistor 53 is provided for each column selection line CSL. Alternatively, the complementary column-related power supply enable signal /CEN may be supplied to column decode circuit 17a for fixing the output signal of column decode circuit 17a low.

According to the third embodiment of the present invention, as hereinabove described, supply of the power supply voltage to column-related circuit 35c is stopped in the sleep mode when memory circuit 3 is a DRAM, whereby current consumption in memory circuit 3 can be reduced.

[Fourth Embodiment]

Figure 21:
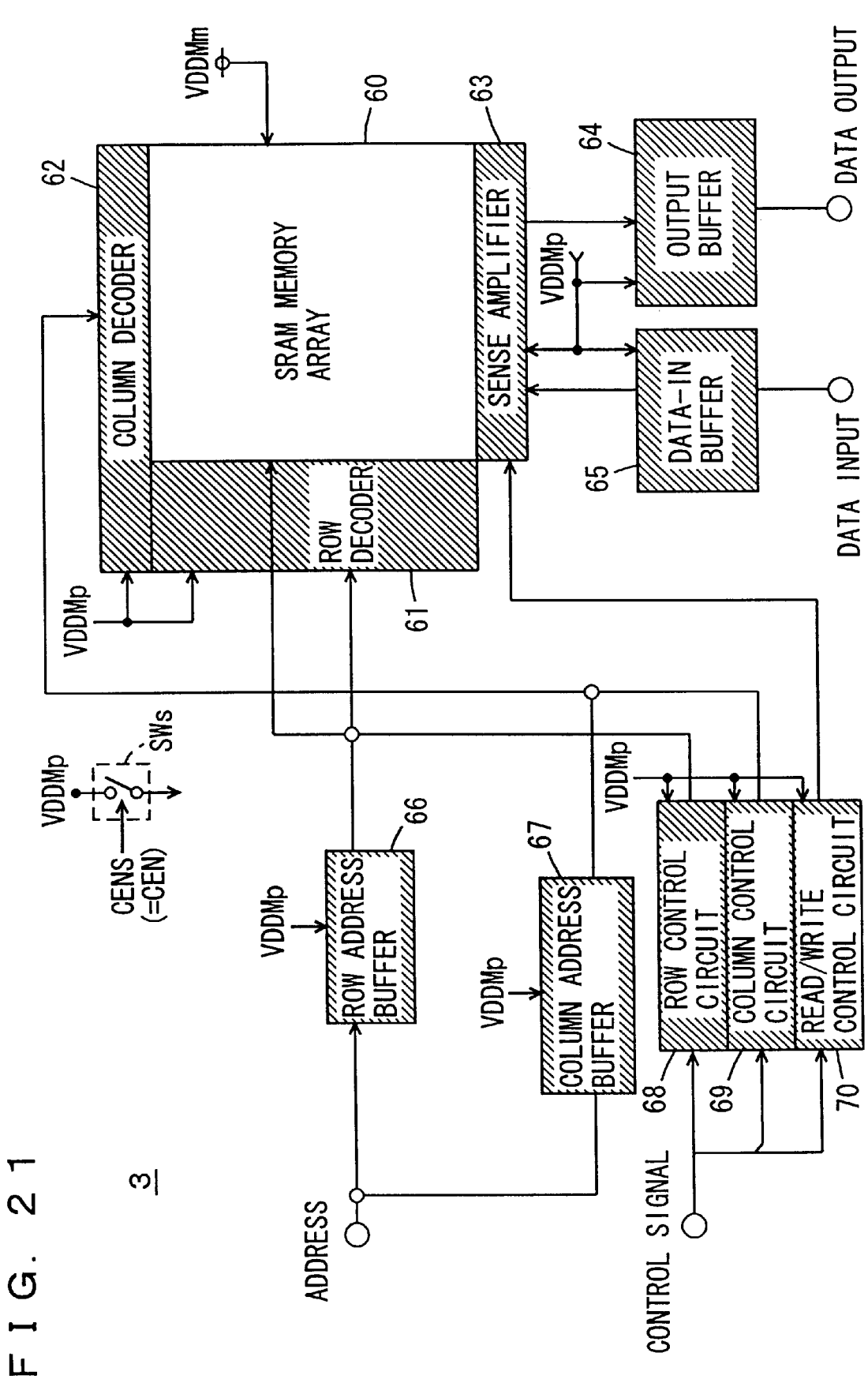
FIG. 21 schematically illustrates the structure of a memory circuit of a semiconductor integrated circuit device according to a fourth embodiment of the present invention.

FIG. 21 schematically illustrates the structure of memory circuit 3 according to a fourth embodiment of the present invention. Referring to FIG. 21, memory circuit 3 includes an SRAM memory array 60 having static memory cells arranged in rows and columns, a row decoder 61 for selecting an addressed row of SRAM memory array 60, a column decoder 62 for selecting an addressed column of SRAM memory array 60, a sense amplifier 63 for amplifying memory cell data on the column selected by column decoder 62, an output buffer 64 for buffering internal read data read by sense amplifier 63 and outputting the buffered data, and a data-in buffer 65 buffering externally supplied write data, generating internal write data and writing the data in a selected memory cell through a write driver (not shown).

The memory circuit 3 further includes a row address buffer 66 and a column address buffer 67 buffering a row address signal and a column address signal externally supplied at the same time respectively, a row control circuit 68 controlling an operation related to row selection in accordance with a control signal supplied to a control signal input node, a column control circuit 69 controlling an operation related to column selection in accordance with a control signal supplied to the control signal input node, and a read/write control circuit 70 controlling an operation related to data writing/reading in accordance with a control signal supplied to the control signal input node.

The row control circuit 68 and the column control circuit 69 operate in parallel when a chip select signal CS or a data access command (a read command or a write command) is supplied, for example, to control operations of row decoder 61 and column decoder 62, respectively. The row address buffer 66 and column address buffer 67 statically operate (in the case of a standard SRAM), to generate internal address signals in accordance with an address signal supplied to an address input node. When memory circuit 3 is a clock synchronous static memory such as a burst SRAM, row address buffer 66 and column address buffer 67 take in address signals and/or generate internal address signals under the control of an address control circuit (not shown).

In memory circuit 3 shown in FIG. 21, SRAM memory array 60 is regularly supplied with an array power supply voltage VDDMm while memory peripheral circuits including row decoder 61, column decoder 62, sense amplifier 63, output buffer 64, data-in buffer 65, row address buffer 66, column address buffer 67, row control circuit 68, column control circuit 69 and read/write control circuit 70 are supplied with a peripheral power supply voltage VDDMp through a power supply switching circuit SWs. The power supply switching circuit SWs is rendered non-conductive when a power supply control signal CENS (=CEN) is activated, and rendered non-conductive after completion of data saving in a sleep mode.

The SRAM memory array 60 is regularly supplied with array power supply voltage VDDMm, for stably holding saved data.

Figure 22:
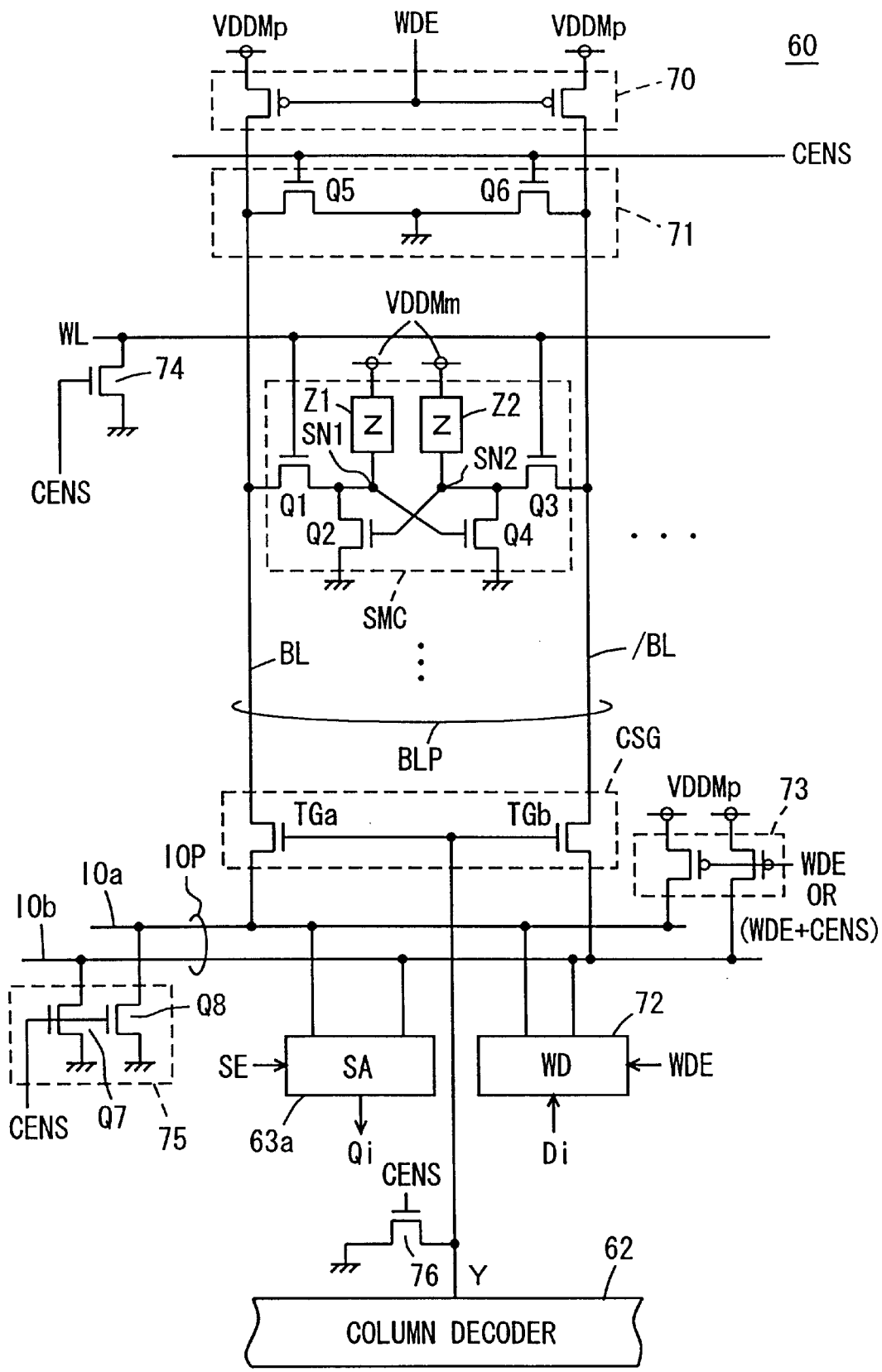
FIG. 22 schematically illustrates the structure of a main part of the memory circuit shown in FIG. 21.

FIG. 22 schematically illustrates the structures of SRAM memory array 60 and sense amplifier 63 shown in FIG. 21. Referring to FIG. 21, a static memory cell SMC is arranged on the intersection between a pair of bit lines BLP and a word line WL. The static memory cell SMC includes access transistors Q1 and Q3 rendered conductive in response to the signal potential on word line WL and N-channel MOS transistors Q2 and Q4 having cross-coupled gates and drains. The gate of MOS transistor Q2 is coupled to a storage node SN2, and the gate of MOS transistor Q4 is coupled to a storage node SN1.

The storage nodes SN1 and SN2 are coupled to array power supply nodes through high-resistance load elements Z1 and Z2. These array power supply nodes are supplied with array power supply voltage VDDMm.

A bit line load circuit 70 rendered conductive when a write driver enable signal WDE is inactivated for supplying a power supply voltage VDDMp to bit lines BL and /BL, a bit line reset circuit 71 rendered conductive when power supply control signal CENS is activated for transmitting the ground voltage to bit lines BL and /BL, and a column selection gate CSG rendered conductive in accordance with a column selection signal Y from column decoder 62 for connecting the pair of bit lines BLP to the pair of internal data lines IOP are provided for the pair of bit lines BLP.

The bit line reset circuit 71 includes N-channel MOS transistors Q5 and Q6 rendered conductive, when power supply control signal CENS is activated, for supplying the ground voltage to bit lines BL and /BL, respectively.

The column selection gate CGS includes transfer gate transistors 1TGa and TGb rendered conductive in response to column selection signal Y for connecting bit lines BL and /BL to internal data lines IOa and IOb, respectively.

A sense amplifier circuit (SA) 63a activated in response to activation of sense amplifier enable signal SE for differentially amplifying the potential difference of the pair of internal data lines IOP and generating internal read data Qi, a write driver (WD) 72 activated when write driver enable signal WDE is activated for driving the pair of internal data lines IOP in accordance with internal write data Di from data-in buffer 65 shown in FIG. 21, an internal data line precharge circuit 73 rendered conductive when write driver enable signal WDE is inactivated for transmitting the peripheral power supply voltage VDDMp to internal data lines IOa and IOb and an internal data line reset circuit 75 rendered conductive when power supply control signal CENS is activated for fixing internal data lines IOa and IOb to the ground voltage level are provided for the pair of internal data lines IOP. The internal data line reset circuit 75 includes N-channel MOS transistors Q7 and Q8 provided in correspondence to internal data lines IOb and IOa, respectively.

A row selection signal from row decoder 61 shown in FIG. 21 is transmitted onto the word line WL. A word line reset transistor 74 rendered conductive when power supply control signal CENS is activated for fixing the word line WL to the ground voltage level is provided for word line WL. A column reset transistor 76 rendered conductive when power supply control signal CENS is activated for fixing the column selection signal Y to the ground voltage level is similarly provided for column selection line CSL.

In a normal mode, the power supply control signal CENS is low, bit line reset circuit 76 is non-conductive and all of internal data line reset circuit 75 and reset transistors 74 and 76 are also non-conductive so that a memory cell SMC is statically selected in accordance with a supplied address signal for reading/writing data.

In the sleep mode, power supply control signal CENS goes high after completion of data transfer (saving of data in a logic circuit) and all of the pair of bit lines BLP, word line WL, the pair of internal data lines IOP and column selection signal Y are fixed to the ground voltage level. Thus, no circuit part enters an electrically floating state in the sleep mode and saved data can be correctly stored in the memory cells SMC with no influence by noise or the like even if row decoder 61 the column decoder 62 statically operate. Further, no part causes a through current resulting from influence by noise or the like due to absence of a floating part, and the saved data can be held with low current consumption.

In the structure shown in FIG. 22, data line precharge circuit 73 precharging the pair of internal data lines IOP may be supplied with a signal obtained by ORing the write driver enable signal WDE and the power supply control signal CENS in order to reliably render the precharge circuit 73 conductive in the sleep mode.

Supply of peripheral power supply voltage VDDMP is stopped in the sleep mode. Even if precharge circuit 73 is conductive in the sleep mode, therefore, internal data line reset circuit 75 discharges the pair of internal data lines IOP to the ground voltage level and peripheral power supply voltage VDDMP is responsively discharged to the ground voltage level at a high speed.

When an SRAM is employed as the memory circuit 3, no particular processing may be performed for fixing an output potential or the like since the power supply voltage for the memory peripheral circuits is set in a supply stop state and supply of power supply voltages to a row-related circuit and a column-related circuit is stopped even if these circuits interact.

[Modification]

Figure 23:
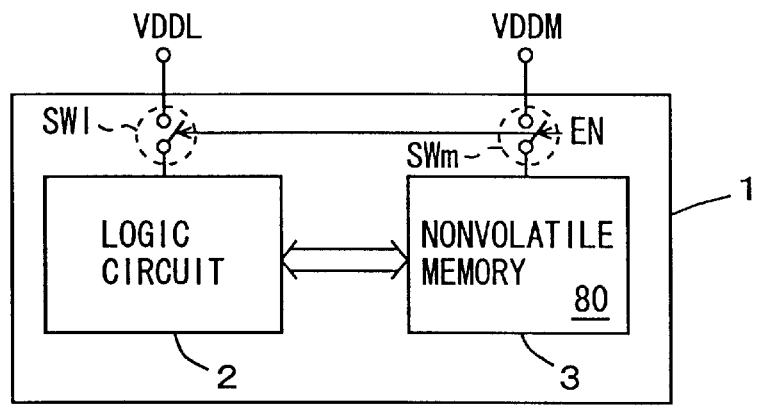
FIG. 23 schematically illustrates the structure of an exemplary modification of the fourth embodiment of the present invention.

FIG. 23 schematically illustrates the structure of a memory-embedded LSI 1 according to a modification of the fourth embodiment of the present invention. Referring to FIG. 23, memory-embedded LSI 1 includes a nonvolatile memory 80 as a memory circuit 3 integrated on the same substrate with a logic circuit 2. The logic circuit 2 and the nonvolatile memory 80 are supplied with power supply voltages VDDL and VDDM through power supply switching circuits SWl and SWm, respectively.

The nonvolatile memory 80 holds the storage contents thereof even if supply of power supply voltage VDDM is stopped. Therefore, supply of power supply voltage VDDM to nonvolatile memory 80 is stopped in a sleep mode. In a standby state in the sleep mode of memory-embedded LSI 1, supply of power supply voltages VDDL and VDDM to logic circuit 2 and memory circuit 3 can be stopped for further reducing power consumption.

Figure 24:
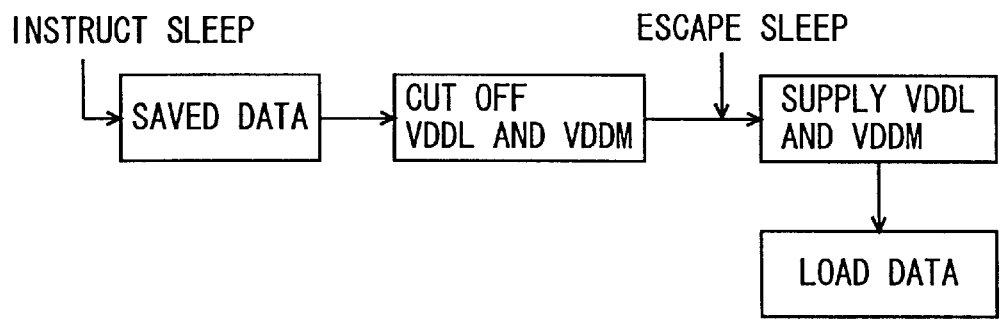
FIG. 24 is a flow chart showing an operation sequence of the semiconductor integrated circuit device according to the fourth embodiment of the present invention.

FIG. 24 is a flow chart showing an operation sequence in the sleep mode of semiconductor integrated circuit device 1 shown in FIG. 23. When a sleep mode instruction is supplied as a system command, data held in logic circuit 2 are first saved to nonvolatile memory 80. After completion of this data saving, switching circuits SWl and SWm are turned off to cut off the power supply voltages VDDL and VDDM to logic circuit 2 and memory circuit 3. At this time, memory-embedded LSI 1 is in a standby state. When the system command instructs the exit of the sleep mode, power supply voltages VDDL and VDDM are externally supplied again for enabling the logic circuit 2 and the nonvolatile memory 80 and then loading the saved data from nonvolatile memory 80 into logic circuit 2. After completion of this data loading, memory-embedded LSI 1 waits for a next command.

In the structure shown in FIG. 23, power supply switching circuits SWl and SWm are set non-conductive in the sleep mode in accordance with a power supply flag EN. Alternatively, supply of power supply voltages VDDL and VDDM may be stopped and power supply switching circuits SWl and SWm may be removed.

According to the fourth embodiment of the present invention, as hereinabove described, the power supply voltage is supplied only to memory array 60 when memory circuit 3 is an SRAM while supply of power supply voltage VDDM to memory circuit 3 is stopped when memory circuit 3 is a nonvolatile memory (e.g., a flash memory), whereby current consumption of memory circuit 3 can be further reduced to implement a semiconductor integrated circuit device (memory-embedded LSI) capable of stably holding saved data with low current consumption.

[Fifth Embodiment]

Figure 25:
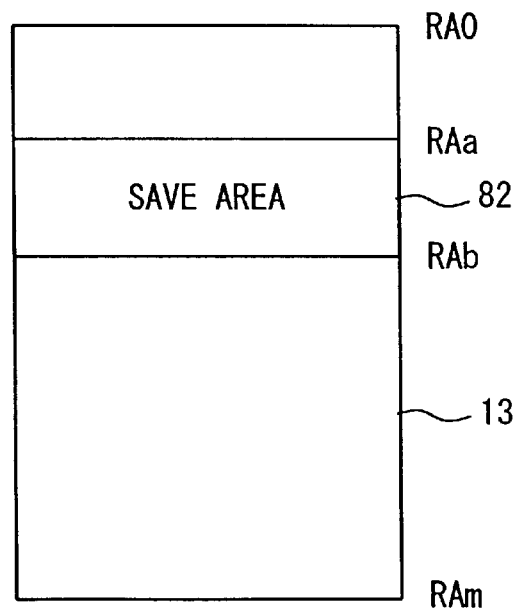
FIG. 25 schematically illustrates the structure of an array part of a memory circuit of a semiconductor integrated circuit device according to a fifth embodiment of the present invention.

FIG. 25 schematically illustrates the structure of an array part of a memory circuit of a memory-embedded LSI according to a fifth embodiment of the present invention. Referring to FIG. 25, the memory circuit is formed by a DRAM, and memory array 13 shown in FIG. 13 includes a save area 82 storing data saved from a logic circuit. The memory array 13 has an address space of row addresses RA0 to RAm. The save area 82 has an address space of row addresses RAa to RAb. The fixedly set save area 82 stores the data saved from the logic circuit.

Figure 26:
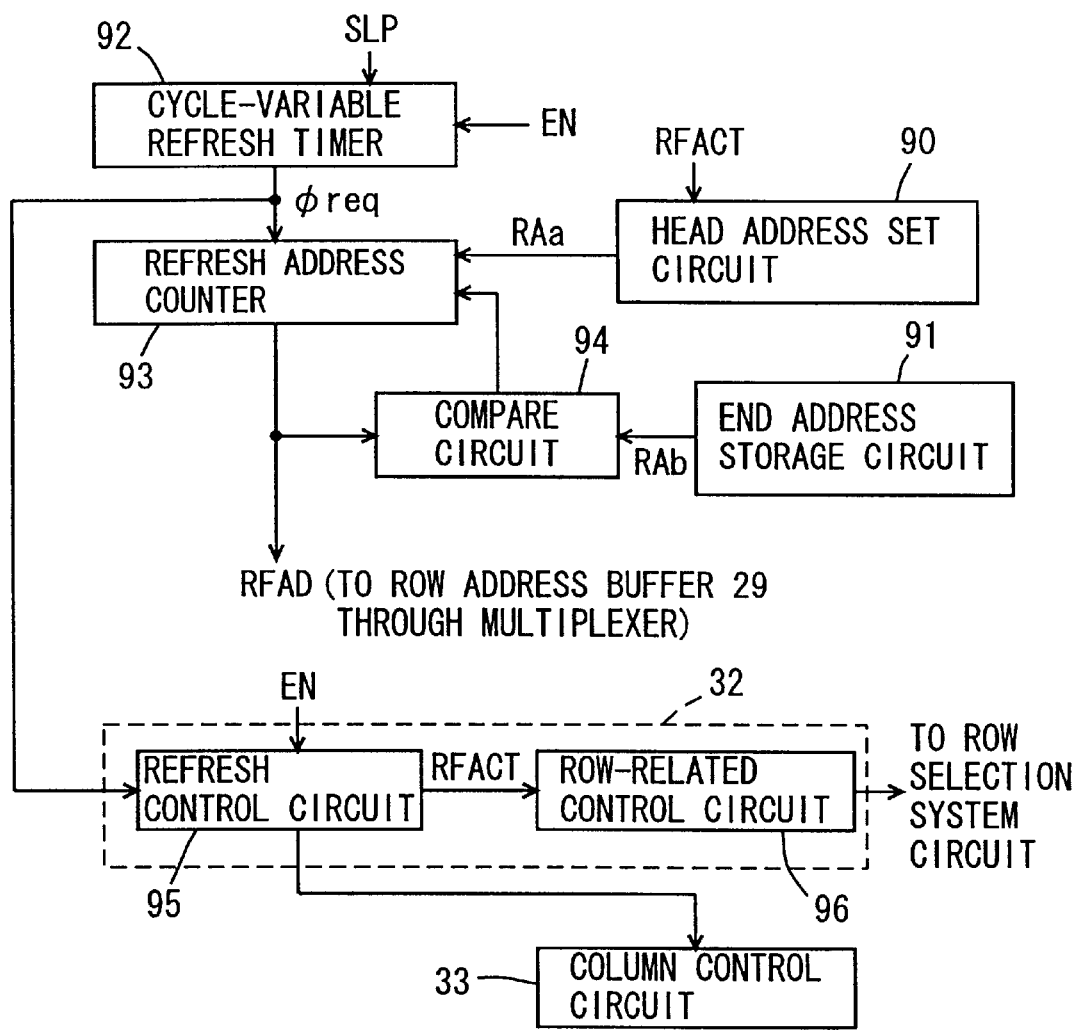
FIG. 26 schematically illustrates the structure of a refresh control part of the semiconductor integrated circuit device according to the fifth embodiment of the present invention.

FIG. 26 schematically illustrates the structure of a refresh control part of the memory circuit according to the fifth embodiment of the present invention. Referring to FIG. 26, the refresh control part includes a head address set circuit 90 setting the head address RAa of the save area 82 and setting the stored head address RAa as an initial value for a refresh address counter 93, an end address storage circuit 91 storing the end address RAb, a cycle-variable refresh timer 92 having a cycle varied in accordance with a power supply flag EN for outputting a refresh request signal Φreq every set cycle, the refresh address counter 93 incrementing or decrementing its count value in accordance with refresh request signal Φreq from cycle-variable refresh timer 92 and outputting a refresh address RFAD, and a compare circuit 94 comparing the refresh address RFAD output from refresh address counter 93 with the end address RAb stored in end address storage circuit 91 and supplying a match detection signal to refresh address counter 93.

When supplied with the match detection signal from compare circuit 94, refresh address counter 93 resets its count value to the head address RAa from head address set circuit 90. When the output of compare circuit 94 indicates match detection, the count value of refresh address counter 93 is forcibly reset to head address RAa from head address set circuit 90 after completion of the current refresh cycle. Therefore, head address set circuit 90 outputs the head address RAa stored therein when a refresh activation signal RFACT is inactivated to change the count value of refresh address counter 93.

A row control circuit 32 shown in FIG. 26 includes a refresh control circuit 95 outputting the refresh activation circuit RFACT having a prescribed pulse width in accordance with refresh request signal Φreq from cycle-variable refresh timer 92 and a row-related control circuit 96 controlling row selection in accordance with refresh activation signal RFACT from refresh control circuit 95. The refresh control circuit 95 stops an operation of a column control circuit 33 when power supply flag EN is inactivated, in order to inhibit an operation of a column-related circuit since only a refresh operation is performed in the sleep mode.

A row selection related circuit includes a row decoder, a sense amplifier and a bit line precharge/equalize circuit, similarly to that shown in FIG. 13. The refresh control circuit 95 is shown being activated when power supply flag EN is inactivated. Also in a refresh cycle (CBR refresh or the like) for refreshing memory cell data in the normal operation mode, however, refresh control circuit 95 generates the refresh activation signal RFACT in accordance with refresh request signal Φreq. Control of the refresh cycle (CBR refresh or the like) in the normal operation mode is not shown. In the self refresh mode, the cycle-variable refresh timer 92 is generally started in accordance with a control signal from the logic circuit in the sleep mode. The cycle-variable refresh timer 92 may alternatively be started under the control of refresh control circuit 95.

The cycle-variable refresh timer 92 lengthens the cycle for outputting the refresh request signal Φreq when power supply flag EN is activated. In the normal operation mode, cycle-variable refresh timer 92 outputs the refresh request signal Φreq in a predetermined cycle.

Figure 27:
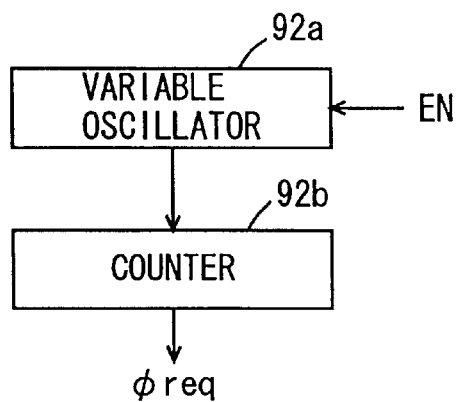
FIG. 27 schematically illustrates the structure of a cycle-variable refresh timer shown in FIG. 26.

FIG. 27 schematically illustrates the structure of cycle-variable refresh timer 92 shown in FIG. 26. Referring to FIG. 27, cycle-variable refresh timer 92 includes a variable oscillator 92a having an oscillation cycle changed in accordance with power supply flag EN, and a counter 92b counting an oscillation output signal from variable oscillator 92a and outputting the refresh request signal Φreq every time a prescribed count value is reached. The variable oscillator 92a is formed by a ring oscillator including an odd number of stages of inverter circuits, for example. The number of the inverter stages of the ring oscillator is varied with activation/inactivation of power supply flag EN, to change the oscillation cycle.

Figure 28:
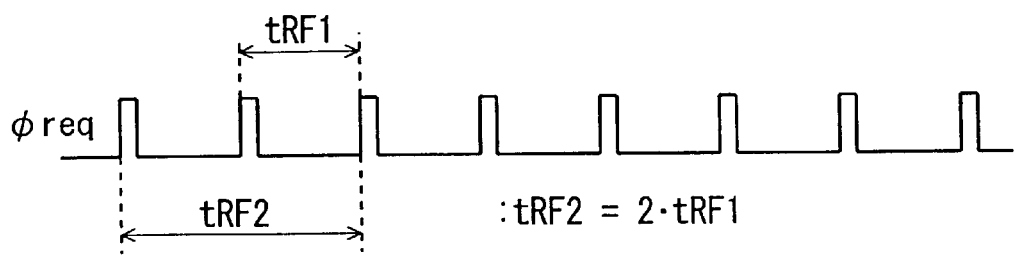
FIG. 28 illustrates a refresh cycle of the memory circuit of the semiconductor integrated circuit device according to the fifth embodiment of the present invention.

FIG. 28 shows the refresh cycle of refresh request signal Φreq in refreshing all word line addresses RA0 to RAm of memory array 13. In this case, the refresh request signal Φreq is output at a refresh cycle tRF1.

Figure 29:
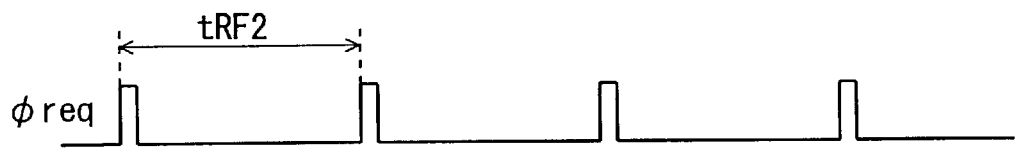
FIG. 29 illustrates a refresh cycle in a sleep mode of the semiconductor integrated circuit device according to the fifth embodiment of the present invention.

When only the save area 80 is refreshed for refreshing only saved data, the refresh request signal Φreq is activated at a cycle tRF2, as shown in FIG. 29. When the number of word line addresses of save area 80 is half the number of all word line addresses of memory array 13, the refresh cycle tRF2 in the sleep mode is twice the refresh cycle tRF1 in the normal mode. Therefore, the number of times of refreshing can be reduced in the sleep mode for reducing the refresh current (per unit time).

The head address RAa and the end address RAb can be readily stored in head address set circuit 90 and end address storage circuit 91 in transition to the sleep mode by storing these addresses in a mode register circuit provided on the DRAM by a mode register set command, for example.

The memory array 13 is divided into a plurality of memory blocks 14, as shown in FIG. 13. Therefore, the save area 80 can be set in units of blocks by using block addresses as head address RAa and end address RAb respectively.

The save area 80 can be set in units of blocks (two blocks, four blocks, eight blocks, . . . ) by fixing refresh block address bits corresponding to a block address of refresh address counter 93 in accordance with the head block address. When memory array 13 includes 16 blocks, for example, a single memory block can be designated with a block address of four bits. One of four memory blocks can be designated with lower two bits by fixing upper two bits, and the save area 80 is formed by four blocks. The initial and end addresses may be set under the control of transfer control circuit 6 shown in FIG. 1. The save area 80 of an optimum size can be set depending on application and the scale of the logic circuit without previously fixing the save area 80 as a default value.

Figure 30:
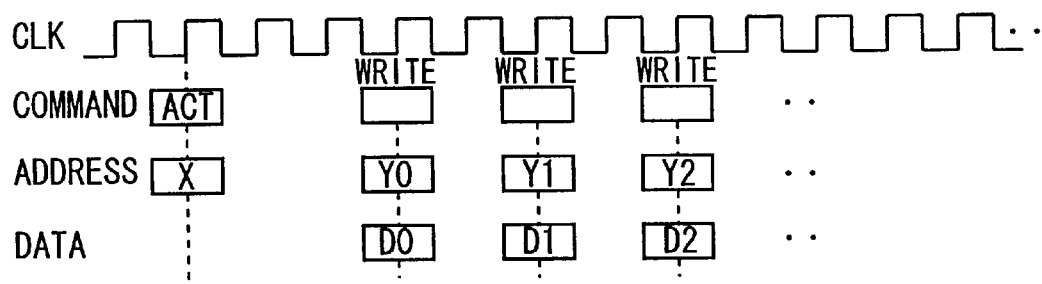
FIG. 30 schematically illustrates a data transfer sequence in the fifth embodiment of the present invention.

FIG. 30 is a timing chart showing a data transfer sequence in transition to the sleep mode. In transition to the sleep mode, transfer control circuit 6 (see FIG. 1) first supplies an active command ACT to memory circuit 3 through the logic circuit, for designating a row in memory circuit (DRAM) 3. The row is designated in accordance with an address X. When row selection is completed in memory circuit 3 and the sense amplifier latches memory cell data, transfer control circuit 6 then supplies a write command WRITE instructing data writing to memory circuit 3 with a column address Y0 through the logic circuit while simultaneously supplying write data D0. When data D0 is written, a column address Y1 and data D1 are supplied to the logic circuit with the write command WRITE, and a column address Y2 and write data D2 are further supplied with the write command WRITE under the control of transfer control circuit 6.

When data for one page (one word line) is written, transfer control circuit 6 supplies an active command ACT to memory circuit 3 again through the logic circuit, and accesses the next page. The term "page" indicates an area designated by a single row address.

Data can be successively written in the same page and the number of word lines included in the save area 80 can be reduced by utilizing the page mode (it is assumed here that the burst length is 1). In the page mode, the same row is successively accessed and the next page is selected after all write data are written in the single page. A precharge command is temporarily supplied when the page is changed. The number of times of precharging the memory array 13 of memory circuit 3 can be reduced, and power consumption in data transfer can be responsively reduced.

In the above description, the logic circuit transmits necessary commands and addresses under the control of transfer control circuit 6. This transfer control circuit 6 may alternatively be provided in the logic circuit.

Figure 31:
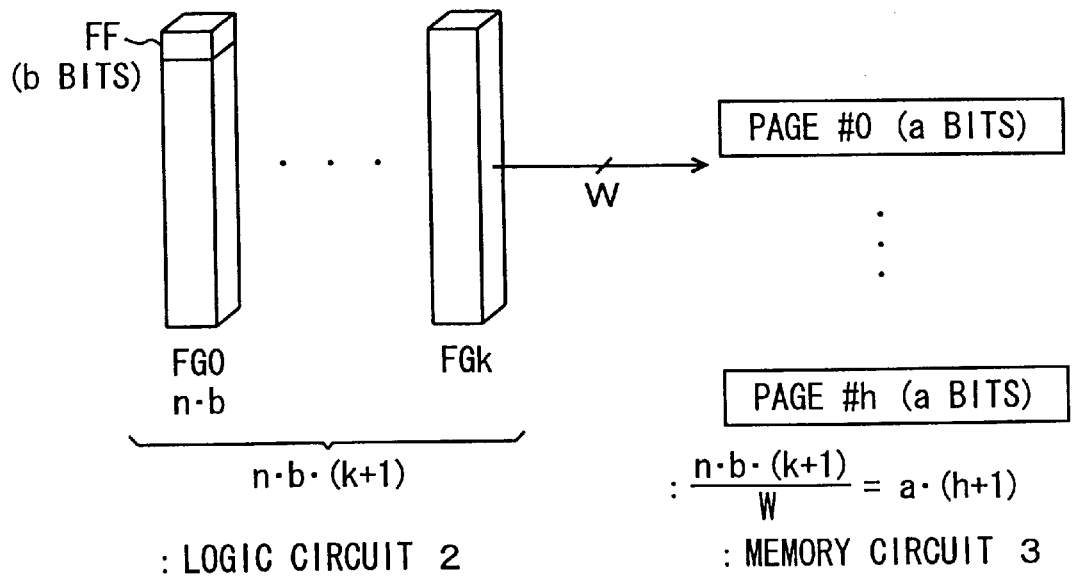
FIG. 31 schematically illustrates the correspondence between saved data and storage pages in data saving in the fifth embodiment of the present invention.

FIG. 31 illustrates the correspondence of data bits in the data transfer. In the logic circuit, each flip-flop group FG includes n flip-flops FF each storing data of b bits. Therefore, the logic circuit stores transfer data of n·b·(k+1) bits in total. Assuming that w represents the bit width of an internal data bus (write data bus), transfer control circuit 6 performs data transfer n·b·(k+1)/w times. When data writing performed by this number of times, data are written in pages #0 to #h in memory circuit 3. Assuming that a single page is formed by "a" bits, the number, (h+1), of pages is expressed as follows:

$$n\cdot b\cdot(k+1)/a=(h+1)$$

The number of data transfer times can be reduced by increasing the data bit width, w.

In the above description, the data are written in the page mode and the burst length is assumed to be 1. If memory circuit 3 is accessible in a burst mode, however, data can be transferred at a higher speed by utilizing the burst mode. The burst mode indicates the number of data (number of clock cycles) successively read when a single write or read command is supplied. In the burst mode, write data can be transferred in each cycle of a clock signal CLK for implementing high-speed data writing/transfer.

The transfer control circuit 6 (see FIG. 1) outputs each command from the relation between the number, a·b·(k+1), of the transfer data of the logic circuit, the bit width, w, of the internal data bus and the bit number, a, of the page of memory circuit 3. The transfer control circuit 6 (see FIG. 1) detects that data are written over an entire page, and then performs a page change operation when the number of times of data transfer reaches a/w. In other words, transfer control circuit 6 temporarily supplies a precharge command when a full page is accessed, and then supplies an active command again for another page accessing.

Figure 32:
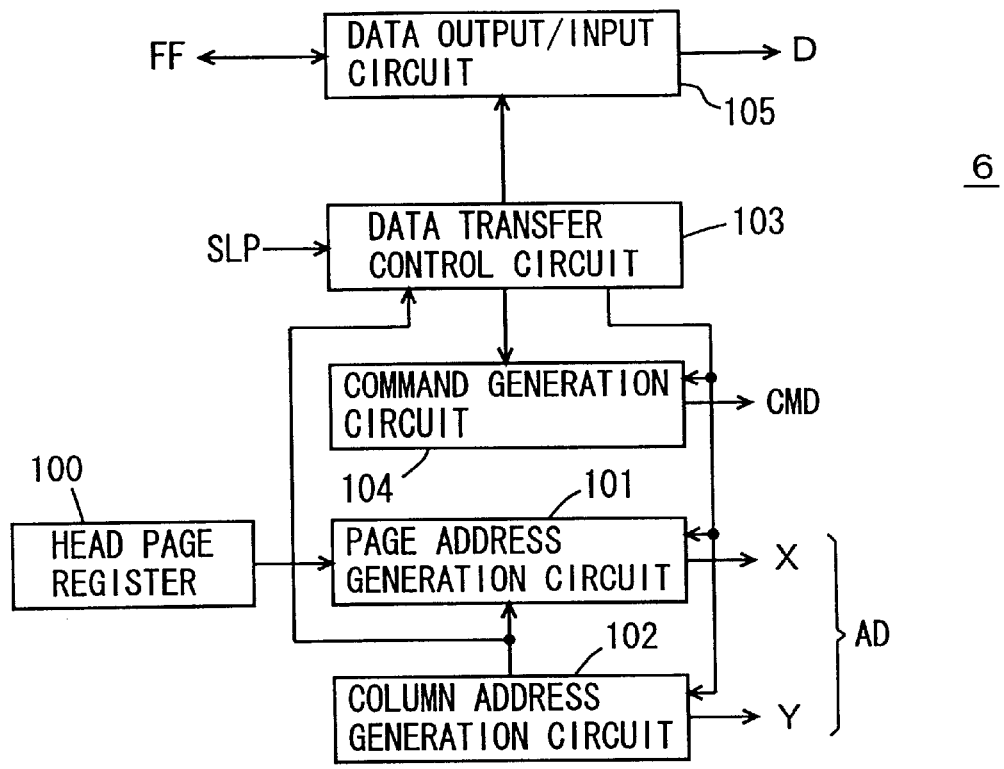
FIG. 32 schematically illustrates the structure of a refresh control part of the semiconductor integrated circuit device according to the fifth embodiment of the present invention.

FIG. 32 schematically illustrates the structure of an address generation part of transfer control circuit 6 shown in FIG. 1. Referring to FIG. 32, transfer control circuit 6 includes a head page register 100 storing a head page address, a data transfer control circuit 103 controlling data transfer when the sleep mode instruction signal SLP is activated, a page address generation circuit 101 generating page addresses in accordance with the head page address stored in head page register 100 under the control of data transfer control circuit 103, a column address generation circuit 102 generating column addresses sequentially from a minimum value to a maximum value, a command generation circuit 104 generating a command CMD under the control of data transfer control circuit 103, and a data output/input circuit 105 inputting/outputting data between the flip-flop FF groups of the logic circuit and the data bus.

When the column address reaches the maximum value, column address generation circuit 102 supplies maximum column address reach information to data transfer control circuit 103. The data transfer control circuit 103 makes the command generation circuit 104 output an active command with the page address from page address generation circuit 101 and thereafter makes the column address generation circuit 102 generate the column address Y until the maximum column address reach information is supplied, and caused the command generation circuit 104 to generate a write command.

When the column address of column address generation circuit 102 reaches the maximum value in the page mode, data transfer control circuit 103 makes the command generation circuit 104 generate a precharge command for temporarily returning the memory array 13 of memory circuit 3 to a precharge state. At this time, the page address of page address generation circuit 101 is incremented by 1 in accordance with the maximum column address reach information from column address generation circuit 102. After completion of precharging, data transfer control circuit 103 makes the command generation circuit 104 generate an active command while making the page address generation circuit 101 generate a new page address X. Command generation circuit 104, page address generation circuit 101 and column address generation circuit 102 output the signals in synchronization with clock signal CLK under the control of data transfer control circuit 103.

The data of logic circuit can be saved to the minimum necessary pages in the page mode by utilizing the address generation part shown in FIG. 32.

When loading data into the logic circuit, data transfer control circuit 103 makes the command generation circuit 104 output a read command in place of a write command in accordance with inactivation of sleep mode instruction signal SLP. At this time, page address generation circuit 101 generates a page address in accordance with the head address from head page address register 100, and data can be transferred in the page mode.

When memory circuit 3 is operable in a burst mode, the numbers of column addresses generated by address generation circuit 102 and write or read commands generated by command generation circuit 104 are reduced in correspondence to the burst length.

According to the fifth embodiment of the present invention, as hereinabove described, only data save area 80 of memory circuit 3 is adapted to be refreshed so that the refresh cycle can be lengthened and current consumption can be responsively reduced in the sleep mode. Further, the number of page changing operations can be reduced by transferring data between the logic circuit and the memory circuit in the page mode or the burst mode, reducing the number of times of array precharge/activation and reducing current consumption since the number of times for supplying charge/discharge current for activating/inactivating a row-related circuit can be reduced.

[Sixth Embodiment]

Figure 33:
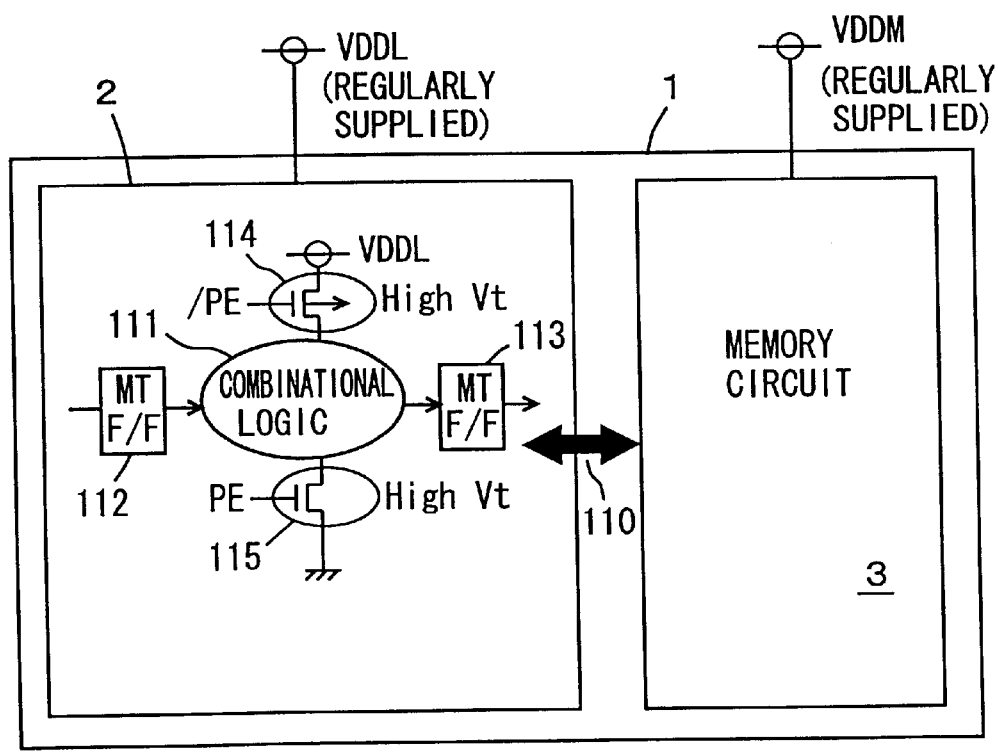
FIG. 33 schematically illustrates the overall structure of a semiconductor integrated circuit device according to a sixth embodiment of the present invention.

FIG. 33 schematically illustrates the overall structure of a memory-embedded LSI 1 according to a sixth embodiment of the present invention. In memory-embedded LSI 1 shown in FIG. 33, a logic circuit 2 includes a combinational logic circuit 111 inserted between multi-threshold flip-flops (MTF/F) 112 and 113. The combinational logic circuit 111 is coupled to a power supply node through a power supply switching transistor 114 formed of a high threshold voltage (High Vt) p-channel MOS transistor and coupled to a ground node through a power supply switching transistor 115 formed by a high threshold voltage MOS transistor. The power supply switching transistors 114 and 115 are rendered conductive in response to activation of power supply activation signals /PE and PE for supplying an operation power supply voltage VDDL and a ground voltage to combinational logic circuit 111. The logic circuit 2 is regularly supplied with external power supply voltage VDDL. The power supply switching transistors 114 and 115 are rendered non-conductive in a sleep mode only in logic circuit 2, for reducing current consumption in logic circuit 2.

A memory circuit 3 is regularly supplied with a memory power supply voltage VDDM, since a refresh operation must be performed at least in the case of a DRAM. Any of the structures according to the first to fifth embodiments may be employed for memory circuit 3.

Figure 34:
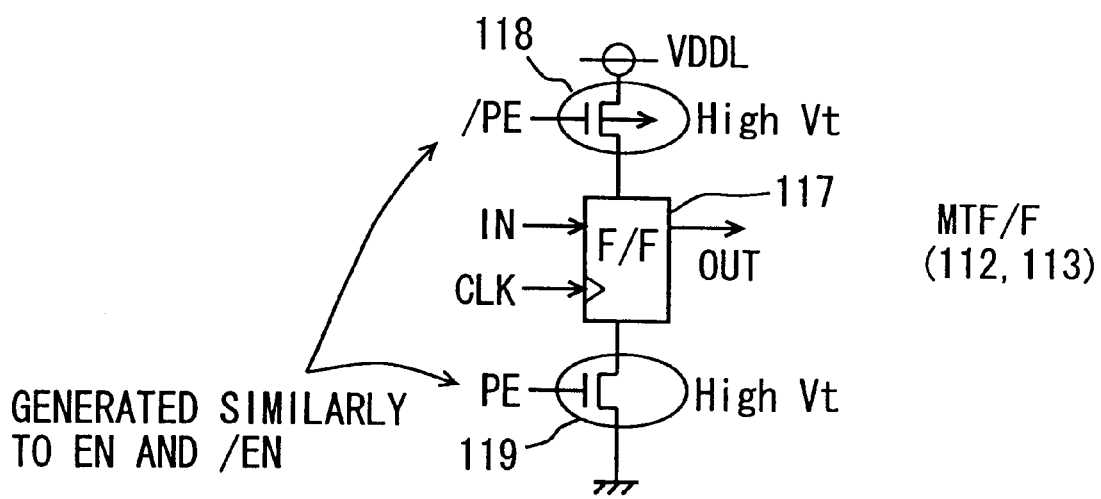
FIG. 34 schematically illustrates the structure of a multi-threshold flip-flop shown in FIG. 33.

FIG. 34 schematically illustrates the structure of each of multi-threshold flip-flops (MTF/F) shown in FIG. 33. Referring to FIG. 34, multi-threshold flip-flop MTF/F (112 or 113) includes a flip-flop (F/F) 117 taking in an input signal IN in synchronization with rise of a clock signal CLK when operates, a power supply switching transistor 118 formed of a high threshold voltage p-channel MOS transistor rendered conductive, when power supply activation signal /PE is activated, for supplying the power supply voltage VDDL to flip-flop 117, and a power supply switching transistor 119 formed of a high threshold voltage n-channel MOS transistor rendered conductive, when power supply activation signal PE is activated, for supplying the ground voltage to flip-flop 117. The high threshold voltage MOS transistors are MOS transistors having large absolute values of threshold voltages.

As shown in FIG. 34, a leakage current (subthreshold leakage current) in flip-flop 117 can be suppressed by stopping supply of the operation power supply voltage to flip-flop 117 when power supply activation signals PE and /PE are inactivated also for multi-threshold flip-flop MTF/F (112 or 113). In particular, high threshold voltage MOS transistors are employed as the power supply switching transistors 118 and 119, and generation of a subthreshold current can be reliably prevented.

Figure 35:
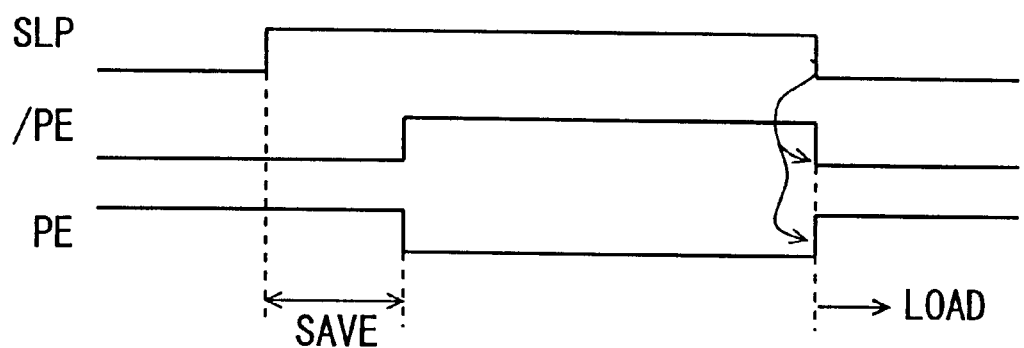
FIG. 35 is a signal waveform diagram representing operations of the semiconductor integrated circuit device according to the sixth embodiment of the present invention.

When a sleep mode instruction signal SLP is activated as shown in FIG. 35, data are saved from logic circuit 2 to memory circuit 3 under the control of a transfer control circuit (not shown) in memory-embedded LSI 1 shown in FIG. 33. After this data saving, power supply activation signals /PE and PE are inactivated to stop supply of operation power supply voltages to multi-threshold flip-flops 112 and 113 and combinational logic circuit 111 in logic circuit 2. Thereafter, this state is maintained during the active state of sleep mode instruction signal SLP.

When sleep mode instruction signal SLP is inactivated, power supply activation signals /PE and PE are activated, all power supply switching transistors 114, 115, 118 and 119 are rendered conductive and the operation power supply voltages are supplied to combinational logic circuit 111 and multi-threshold flip-flops 112 and 113 of logic circuit 2, to enable the logic circuit 2.

The power supply switching transistors 114, 115, 118 and 119 may be provided in correspondence to each combinational logic circuit 111 and each multi-threshold flip-flop MTF/F. Alternatively, power supply switching transistors 114 and 115 may be provided in common to a plurality of combinational logic circuits (see FIG. 3) and power supply switching transistors 118 and 119 may be provided in common to flip-flops 112 and 113. Further, complimentarily operating multi-threshold flip-flops 112 and 113 may be provided with different power supply switching transistors, respectively.

The power supply switching transistors 114, 115, 118 and 119 are appropriately arranged to stabilize the logic circuit 2 and shorten a recovery time of the operation power supply voltages.

The operation power supply voltage for memory circuit 3 may be controlled in accordance with any of the first to fifth embodiments. Power supply activation signals PE and /PE may be generated from flags similar to the flags EN and /EN from power supply flag generation circuit 10 included in transfer control circuit 6 according to the first embodiment.

The memory-embedded LSI 1 shown in FIG. 33 is regularly supplied with external power supply voltages VDDL and VDDM. Therefore, an external system processor, for example, may not stop power supply in the sleep mode, and the burden on the external system processor is reduced.

According to the sixth embodiment of the present invention, as hereinabove described, logic circuit 2 is regularly supplied with the external power supply voltage and supply of the operation power supply voltage is selectively stopped in logic circuit 2 in response to the sleep mode while data held in flip-flops 112 and 113 are transferred to memory circuit 3 before stopping supply of the operation power supply voltage, whereby current consumption in a standby state can be reduced and the internal power supply voltage can be recovered to the original state at a high speed in accordance with load data from memory circuit 3 after exit of the sleep mode, for quickly starting a next operation.

[Other Application]

The above description has been made with reference to a semiconductor integrated circuit device having a logic circuit and a memory circuit integrated on the same semiconductor chip. This semiconductor integrated circuit device may be applied to a portable terminal equipment such as an IC card or a portable telephone. The contents of logical processing executed by the logic circuit are determined depending on the application.

According to the present invention, as hereinabove described, supply of the operation power supply voltage to the logic circuit is stopped after completion of data transfer from the logic circuit to the memory circuit in the sleep mode of the semiconductor integrated circuit device having the logic circuit and the memory circuit formed on the same chip, whereby power consumption in the standby state can be reduced. Further, the logic circuit can be immediately returned to the original state after completion of the sleep mode by loading the saved data from the memory circuit into the logic circuit, for preparing for next processing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   logic circuitry for performing a prescribed processing on a supplied signal;
   memory circuitry formed on a common semiconductor substrate to said logic circuitry for storing at least data used by said logic circuitry;
   data save circuitry for transferring data of said logic circuitry to said memory circuitry for storage in said memory circuitry in a specific operation mode; and
   a power source for stopping supply of a power supply voltage to said logic circuitry after the transfer of data in said specific operation mode.

2. The semiconductor integrated circuit device according to claim 1, wherein said logic circuitry includes:
   a plurality of flip-flops for transferring data in synchronization with a clock signal, and
   a logic processing circuit for performing prescribed processing on an output signal of a first predetermined flip-flop for outputting to a second predetermined flip-flop; and
   said data save circuitry includes means for transferring data signals held by said plurality of flip-flops to said memory circuitry in said specific operation mode.

3. The semiconductor integrated circuit device according to claim 1, wherein said data save circuitry includes a flag generation circuit for generating a flag designating said specific operation mode, and
   said memory circuitry includes an interface circuit entering an output high impedance state when a flag from said flag generation circuit designates said specific operation mode, said interface circuit including an input circuit receiving data from said logic circuitry.

4. The semiconductor integrated circuit device according to claim 1, further comprising a load control circuit for loading data saved to said memory circuitry into said logic circuitry when said specific operation mode is completed.

5. The semiconductor integrated circuit device according to claim 1, wherein said memory circuitry includes:
   a memory array having a plurality of dynamic memory cells arranged in rows and columns,
   a row-related circuit performing an operation related to selection of a row in said memory array, and
   a column-related circuit performing an operation related to selection of a column in said memory array; and
   said power source includes a column-related power supply circuit for stopping supply of a power supply voltage to said column-related circuit in said specific operation mode.

6. The semiconductor integrated circuit device according to claim 5, wherein supply of a power supply voltage to said column-related power supply circuit from an outside of said memory circuitry is stopped in said specific operation mode.

7. The semiconductor integrated circuit device according to claim 5, wherein said row-related circuit receives an operation power supply voltage continuously in said specific operation mode and includes a refresh control circuit for refreshing data stored in the memory cells of said memory array.

8. The semiconductor integrated circuit device according to claim 1, wherein said memory circuitry includes:
   a memory array having a plurality of static memory cells arranged in rows and columns, and
   a peripheral circuit for accessing a memory cell of said memory array; and
   said power source includes a memory power source for continuously supplying an array power supply voltage to said memory array and stopping supply of a peripheral power supply voltage to said peripheral circuit in said specific operation mode.

9. The semiconductor integrated circuit device according to claim 1, wherein said memory circuitry includes:
   a memory array having a plurality of nonvolatile memory cells arranged in rows and columns, and
   a peripheral circuit for accessing a memory cell of said memory array; and
   said power source includes a memory power source for stopping supply of a power supply voltage to said memory array and said peripheral circuit in said specific operation mode.

10. The semiconductor integrated circuit device according to claim 9, wherein said memory power source includes a power supply node receiving the power supply voltage supplied from an outside of said memory circuitry, and supply of said power supply voltage from the outside of said memory circuitry is stopped in said specific operation mode.

11. The semiconductor integrated circuit device according to claim 1, wherein said memory circuitry includes a memory array having a plurality of memory cells arranged in rows and columns, and
   said data save circuitry includes means for generating an address so as to repetitively access a same row of said memory array.

12. The semiconductor integrated circuit device according to claim 7, wherein said refresh control circuit includes means for generating an address so as to refresh data of an area of said memory array, said area storing the data saved by said data save circuitry.

13. The semiconductor integrated circuit device according to claim 7, wherein said refresh control circuit includes means for increasing a refresh interval in said specific operation mode beyond a refresh interval in a normal mode.

14. The semiconductor integrated circuit device according to claim 7, wherein said refresh control circuit includes:
   a refresh address counter for generating a refresh address designating a refresh row, and
   a refresh area set circuit for setting a range of the address generated by said refresh address counter in said specific operation mode.

15. The semiconductor integrated circuit device according to claim 1, wherein said power source includes a logic power source provided dedicate to said logic circuitry, for stopping supply of the power supply voltage to said logic circuitry in said specific operation mode.

16. The semiconductor integrated circuit device according to claim 15, wherein said logic power source includes a power supply node receiving an external power supply voltage, and supply of the external power supply voltage is stopped in said specific operation mode.

17. The semiconductor integrated circuit device according to claim 15, wherein said logic circuitry includes:
   a plurality of flip-flops each transferring a signal in synchronization with a clock signal, and
   a plurality of arithmetic circuits each receiving an output signal of a predetermined first flip-flop included in said plurality of flip-flops, performing prescribed processing and transferring a resultant signal to a predetermined second flip-flop in said plurality of flip-flops;
   said logic power source includes:
      a first power source for supplying a power supply voltage to the arithmetic circuits, and
      a flip-flop power source provided to each said flip-flop for supplying an operation power supply voltage to each said flip-flop;
      said flip-flop power source includes a switching transistor turned off in said specific operation mode to stop supply of said operation power supply voltage to each flip-flop; and
   said first power source induces a second switching transistor turned off to stop supply of said power supply voltage to said arithmetic circuits in said specific operation mode.

18. The semiconductor integrated circuit device according to claim 5, wherein said column-related circuit includes a column selection control circuit activated in response to an output signal received from a row selection control circuit included in said row-related circuit, for performing an operation related to column selection, and
   said semiconductor integrated circuit device further comprises control means for fixing a logical level of an output signal from said column selection control circuit in said specific operation mode.

19. The semiconductor integrated circuit device according to claim 5, wherein said column-related circuit includes a column access control circuit controlling a data access circuit communicating data with said memory array, and
   said semiconductor integrated circuit device further comprises control means for forcibly setting an output signal of said column access control circuit to an inactive state in said specific operation mode.

20. The semiconductor integrated circuit device according to claim 5, further comprising control means for fixing a logical level of an output signal of said column-related circuit in said specific operation mode.

* * * * *